US011233949B2

(12) United States Patent
Fujikawa et al.

(10) Patent No.: US 11,233,949 B2
(45) Date of Patent: Jan. 25, 2022

(54) IMAGE CAPTURING APPARATUS, CONTROL METHOD FOR IMAGE CAPTURING APPARATUS, AND CONTROL PROGRAM FOR IMAGE CAPTURING APPARATUS

(71) Applicant: FUJIFILM Corporation, Tokyo (JP)

(72) Inventors: Tetsuya Fujikawa, Saitama (JP); Mototada Otsuru, Saitama (JP)

(73) Assignee: FUJIFILM Corporation, Tokyo (JP)

( * ) Notice: Subject to any disclaimer, the term of this patent is extended or adjusted under 35 U.S.C. 154(b) by 249 days.

(21) Appl. No.: 16/729,502

(22) Filed: Dec. 30, 2019

(65) Prior Publication Data
US 2020/0137288 A1 Apr. 30, 2020

Related U.S. Application Data

(63) Continuation of application No. PCT/JP2018/015343, filed on Apr. 12, 2018.

(30) Foreign Application Priority Data

Aug. 18, 2017 (JP) .............................. JP2017-158004

(51) Int. Cl.
H04N 5/235 (2006.01)
G03B 7/093 (2021.01)
(Continued)

(52) U.S. Cl.
CPC ........... *H04N 5/2353* (2013.01); *G03B 7/093* (2013.01); *H01L 27/14625* (2013.01); *H04N 5/353* (2013.01)

(58) Field of Classification Search
CPC ...... H04N 5/2353; H04N 5/353; G03B 7/093; H01L 27/14625
See application file for complete search history.

(56) References Cited

U.S. PATENT DOCUMENTS 9,182,650 B2 11/2015 Takagi
9,319,594 B2 4/2016 Iwasaki
(Continued)

FOREIGN PATENT DOCUMENTS

JP 2003322878 11/2003
JP 2004056331 2/2004
(Continued)

OTHER PUBLICATIONS

"International Search Report (Form PCT/ISA/210) of PCT/JP2018/015343," dated Jun. 19, 2018, with English translation thereof, pp. 1-5.
(Continued)

*Primary Examiner* — Twyler L Haskins
*Assistant Examiner* — Fayez A Bhuiyan
(74) *Attorney, Agent, or Firm* — JCIPRNET

(57) ABSTRACT

A CPU performs an amount-of-exposure control process to thereby function as a first control unit that controls the exposure time of pixels to control the amount of exposure of the pixels for each of a plurality of division regions obtained by dividing a captured image and as a second control unit that controls the light transmittance of an ND filter to adjust the difference in amount of exposure between the plurality of division regions for each of which the amount of exposure is controlled by controlling the exposure time. On a touch panel display, the captured image obtained with the amount of exposure controlled by the CPU in accordance with a combination of the exposure time and the light transmittance of the ND filter is displayed.

20 Claims, 18 Drawing Sheets

(51) Int. Cl.
*H01L 27/146* (2006.01)
*H04N 5/353* (2011.01)

(56) References Cited

U.S. PATENT DOCUMENTS

| | | | |
|---|---|---|---|
| 2004/0066563 | A1 | 4/2004 | Voss et al. |
| 2009/0109304 | A1 | 4/2009 | Guan |
| 2015/0207973 | A1* | 7/2015 | Iwasaki ............... H04N 5/2353 348/229.1 |
| 2020/0099841 | A1* | 3/2020 | Sugimoto ............. H04N 5/238 |
| 2020/0137284 | A1* | 4/2020 | Masuda ............... G03B 7/093 |

FOREIGN PATENT DOCUMENTS

| | | |
|---|---|---|
| JP | 2004126574 | 4/2004 |
| JP | 2006245918 | 9/2006 |
| JP | 2009110137 | 5/2009 |
| JP | 2009290255 | 12/2009 |
| JP | 2013088597 | 5/2013 |
| JP | 2015136087 | 7/2015 |
| JP | 2016015599 | 1/2016 |
| JP | 2017044816 | 3/2017 |
| JP | 2017046217 | 3/2017 |
| JP | 2017098790 | 6/2017 |

OTHER PUBLICATIONS

"International Preliminary Report on Patentability (Form PCT/IPEA/409) of PCT/JP2018/015343," dated Dec. 13, 2018, with English translation thereof, pp. 1-22.

* cited by examiner

FIG. 17
FIG. 18
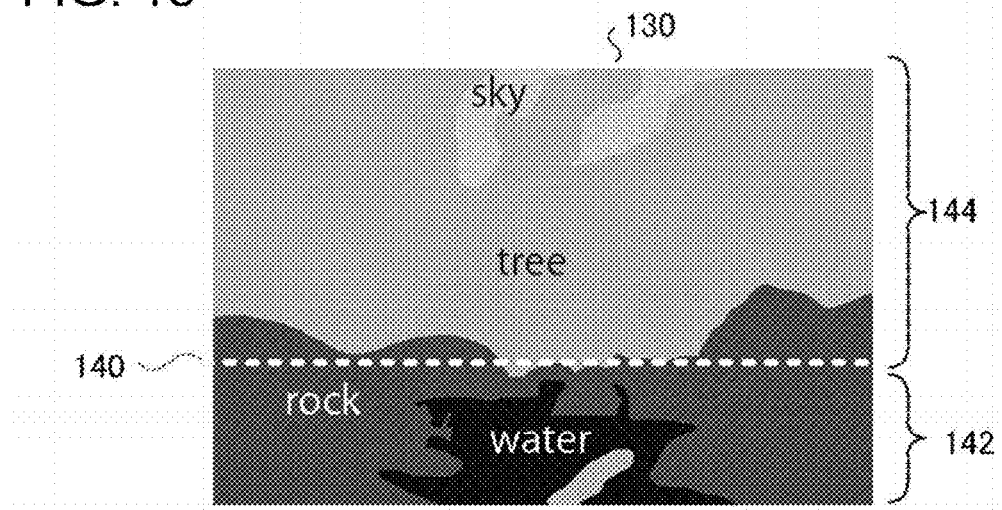
FIG. 19
| TYPE OF OBJECT | EXPOSURE TIME |
|---|---|
| WATER | ** SEC. |
| SKY | // SEC. |
| TREE | ●● SEC. |

IMAGE CAPTURING APPARATUS, CONTROL METHOD FOR IMAGE CAPTURING APPARATUS, AND CONTROL PROGRAM FOR IMAGE CAPTURING APPARATUS

CROSS-REFERENCE TO RELATED APPLICATIONS

This application is a Continuation of PCT International Application No. PCT/JP218/015343 filed on Apr. 12, 2018, which claims priority under 35 U.S.C. § 119(a) to Japanese Patent Application No. 2017-158004 filed on Aug. 18, 2017. Each of the above application(s) is hereby expressly incorporated by reference, in its entirety, into the present application.

BACKGROUND OF THE INVENTION

1. Field of the Invention

A technique of the present disclosure relates to an image capturing apparatus, a control method for an image capturing apparatus, and a control program for an image capturing apparatus.

2. Description of the Related Art

For an image capturing apparatus in which image capturing of a photographic subject is performed by an imaging device through an image capturing optical system, as a technique for controlling the amount of exposure of the imaging device, a technique using a digital ND (neutral density) filter is disclosed in, for example, JP2015-136087A, JP2004-56331A, and JP2003-322878A. With the digital ND filter, an effect equivalent to that attained by providing a physical ND filter for the image capturing optical system can be attained.

As a technique for capturing an image of a photographic subject by using an image capturing apparatus, a technique called long exposure is available in which control for making the exposure time longer than usual is performed to thereby capture an image of a photographic subject in motion, such as, for example, a river or a waterfall in motion, including trails thereof. In JP2015-136087A, JP2004-56331A, and JP2003-322878A mentioned above, a technique for controlling the exposure time is disclosed.

SUMMARY OF THE INVENTION

However, in a case where a photographic subject in motion for which the user wants to capture an image including trails thereof or the like and a photographic subject in motion for which the user wants to capture an image without trails thereof, that is, the user does not want the photographic subject to be blurred, are mixed in one captured image, in a case where long exposure is performed, the photographic subject that the user does not want to be blurred may be blurred, and an expression desired by the user might not be achieved.

The present disclosure has been made in view of the above-described circumstances, and an object thereof is to provide an image capturing apparatus, a control method for an image capturing apparatus, and a control program for an image capturing apparatus with which an expression desired by users can be achieved.

To achieve the above-described object, an image capturing apparatus according to a first aspect of the present disclosure includes: an image capturing unit that includes an imaging device in which a plurality of pixels are arranged in a two-dimensional array and that outputs an image signal obtained by image capturing of a photographic subject by the imaging device through an image capturing optical system; an image generation unit that generates a captured image based on the image signal; an amount-of-light control unit that controls an amount of light incident on the imaging device per unit time; a first control unit that controls an exposure time of the pixels to control an amount of exposure of the pixels for each of a plurality of division regions obtained by dividing the captured image; a second control unit that controls the amount-of-light control unit to perform control for adjusting a difference in amount of exposure between the plurality of division regions for each of which the amount of exposure is controlled by the first control unit; and a display unit that displays the captured image obtained with the amount of exposure controlled by the second control unit.

An image capturing apparatus according to a second aspect is the image capturing apparatus according to the first aspect in which the second control unit may perform control to make the difference in amount of exposure between the plurality of division regions be within a predetermined range.

An image capturing apparatus according to a third aspect is the image capturing apparatus according to the second aspect and may further include: a determination unit that determines an amount of exposure of the entire imaging device; and a third control unit that performs control for adjusting the amount of exposure of each of the plurality of division regions for each of which the amount of exposure is controlled by the second control unit to the amount of exposure determined by the determination unit, in which the display unit may display the captured image obtained with the amount of exposure controlled by the third control unit.

An image capturing apparatus according to a fourth aspect is the image capturing apparatus according to the first aspect and may further include a determination unit that determines an amount of exposure of the entire imaging device, in which the second control unit may set the amount of exposure of each of the plurality of division regions to the amount of exposure determined by the determination unit to adjust the difference in amount of exposure between the plurality of division regions.

An image capturing apparatus according to a fifth aspect is the image capturing apparatus according to any one of the first to fourth aspects in which the second control unit may perform control for adjusting the difference in amount of exposure between the plurality of division regions with reference to the amount of exposure controlled by the first control unit for a division region that satisfies a predetermined condition among the plurality of division regions.

An image capturing apparatus according to a sixth aspect is the image capturing apparatus according to the fifth aspect in which the second control unit may use, as the predetermined condition, a condition that the exposure time is shortest.

An image capturing apparatus according to a seventh aspect is the image capturing apparatus according to any one of the first to sixth aspects in which the first control unit may divide the captured image into the plurality of division regions along a boundary line derived from the captured image on the basis of a result of analysis of the captured image.

An image capturing apparatus according to an eighth aspect is the image capturing apparatus according to the seventh aspect in which in a case where a change occurs in the captured image, the first control unit may adjust a position of the boundary line on the basis of the change in the captured image.

An image capturing apparatus according to a ninth aspect is the image capturing apparatus according to any one of the first to eighth aspects and may further include an accepting unit that accepts an exposure time for each of the plurality of division regions, in which the first control unit may perform control in accordance with the exposure time accepted by the accepting unit.

An image capturing apparatus according to a tenth aspect is the image capturing apparatus according to any one of the first to sixth aspects and may further include: a dividing unit that identifies, for each region of the captured image, for each photographic subject included in the captured image, or for each pixel corresponding to the captured image, a corresponding type of object on the basis of a recognition result of recognizing the captured image, and divides the captured image into the plurality of division regions on the basis of a result of identification; and an exposure time determination unit that determines an exposure time for each of the plurality of division regions on the basis of predetermined correspondences between types of objects and exposure times, in which the first control unit may perform control in accordance with the exposure time determined by the exposure time determination unit.

An image capturing apparatus according to an eleventh aspect is the image capturing apparatus according to any one of the first to tenth aspects in which the first control unit may control the exposure time of the pixels for each row of the array of the plurality of pixels.

A control method for an image capturing apparatus according to a twelfth aspect includes a process including: generating a captured image based on an image signal obtained by image capturing of a photographic subject by an imaging device, in which a plurality of pixels are arranged in a two-dimensional array, through an image capturing optical system; performing first control for controlling an exposure time of the pixels to control an amount of exposure of the pixels for each of a plurality of division regions obtained by dividing the captured image; performing second control for controlling an amount-of-light control unit that controls an amount of light incident on the imaging device per unit time to perform control for adjusting a difference in amount of exposure between the plurality of division regions for each of which the amount of exposure is controlled by the first control; and displaying the captured image obtained with the amount of exposure controlled by the second control.

A control program for an image capturing apparatus according to a thirteenth aspect causes a computer to perform a process including: generating a captured image based on an image signal obtained by image capturing of a photographic subject by an imaging device, in which a plurality of pixels are arranged in a two-dimensional array, through an image capturing optical system; performing first control for controlling an exposure time of the pixels to control an amount of exposure of the pixels for each of a plurality of division regions obtained by dividing the captured image; performing second control for controlling an amount-of-light control unit that controls an amount of light incident on the imaging device per unit time to perform control for adjusting a difference in amount of exposure between the plurality of division regions for each of which the amount of exposure is controlled by the first control; and displaying the captured image obtained with the amount of exposure controlled by the second control.

According to the present disclosure, an expression desired by users can be achieved.

BRIEF DESCRIPTION OF THE DRAWINGS

FIG. 17 is a diagram illustrating an example live preview image;

FIG. 18 is a diagram illustrating an example identification result of identifying the types of objects included in the live preview image illustrated in FIG. 17;

FIG. 19 is a diagram illustrating example information indicating correspondences between types of objects and exposure times;

DESCRIPTION OF THE PREFERRED EMBODIMENTS

Hereinafter, example embodiments of the technique of the present disclosure will be described in detail with reference to the drawings.

First Embodiment

Figure 1:
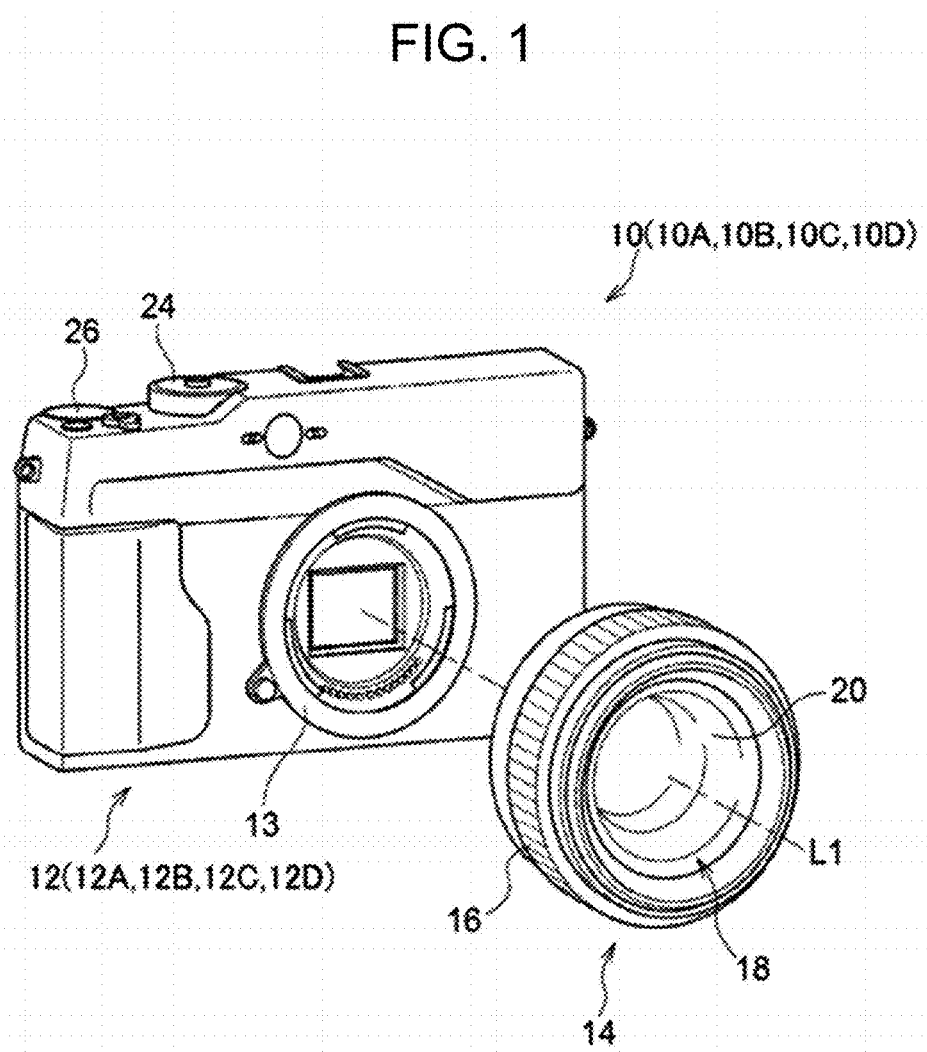
FIG. 1 is a perspective view illustrating an example external appearance of an image capturing apparatus according to first to fifth embodiments.

First, an example configuration of an image capturing apparatus 10 of this embodiment will be described with reference to FIG. 1 to FIG. 3. As illustrated in FIG. 1, for example, the image capturing apparatus 10 of this embodiment is an interchangeable-lens digital camera and includes an image capturing apparatus main body 12 and an image capturing lens 14.

The image capturing lens 14 is attached to the image capturing apparatus main body 12 so as to be interchangeable. On the lens barrel of the image capturing lens 14, a focus ring 16 that is used in a manual focus mode is provided. The image capturing lens 14 includes a lens unit 18. The lens unit 18 of this embodiment is an example of an image capturing optical system of the present disclosure.

The lens unit 18 is a combination lens in which a plurality of lenses including a focus lens 20 are combined. The focus lens 20 moves in the direction of an optical axis L1 in accordance with a manual rotation operation of the focus ring 16, and photographic subject light, which is reflected light representing a photographic subject, forms an image on a photosensitive surface 22A of an imaging device 22 (see FIG. 3) described below at an in-focus position corresponding to the distance to the photographic subject.

On the top surface of the image capturing apparatus main body 12, a dial 24 and a release button 26 are provided. The dial 24 is operated for various settings, such as switching between an image capture mode and a playback mode. Accordingly, in the image capturing apparatus 10, in a case where the dial 24 is operated by the user, the image capture mode or the playback mode is selectively set as an operation mode.

As the operation mode for image capturing, the image capturing apparatus 10 has a still-image capture mode and a moving-image capture mode. The still-image capture mode is an operation mode for recording a still image obtained by image capturing of a photographic subject by the image capturing apparatus 10. The moving-image capture mode is an operation mode for recording a moving image obtained by image capturing of a photographic subject by the image capturing apparatus 10. In this embodiment, a still-image and a moving image are collectively referred to as "captured image" in a case where the still-image and the moving image are not distinguished from each other.

The release button 26 is configured to be capable of detecting a depressing operation in two stages, that is, an image capture preparation instruction state and an image capture instruction state. The image capture preparation instruction state refers to a state where, for example, the release button 26 is depressed from a standby position to an intermediate position (half-push position), and the image capture instruction state refers to a state where the release button 26 is depressed to a final depress position (full-push position) beyond the intermediate position. Hereinafter, the "state where the release button 26 is depressed from the standby position to the half-push position" is called "half-push state", and the "state where the release button 26 is depressed from the standby position to the full-push position" and the "state where the release button 26 is depressed from the half-push position to the full-push position" are called "full-push state".

In an autofocus mode, in a case where the release button 26 is set to the half-push state, image capture conditions are adjusted, and thereafter, in a case where the release button 26 is subsequently set to the full-push state, actual exposure is performed. That is, in a case where the release button 26 is set to the half-push state, an AE (auto-exposure) function is activated and the amount-of-exposure state is set, and thereafter, an AF (autofocus) function is activated and in-focus control is performed. In a case where the release button 26 is set to the full-push state, image capturing is performed.

Figure 2:
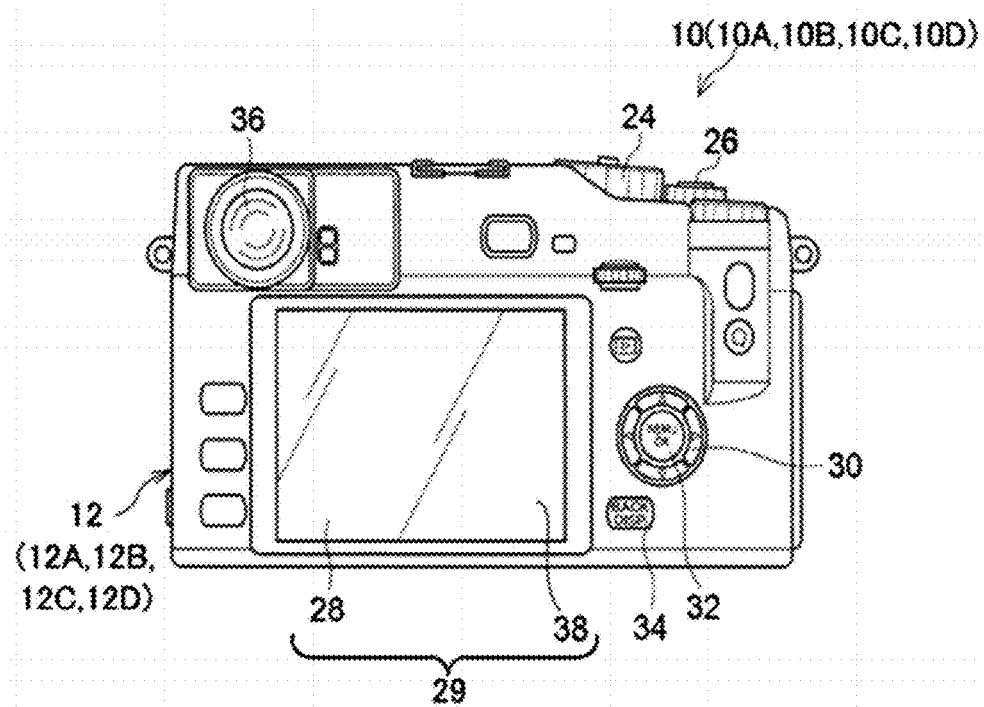
FIG. 2 is a rear view illustrating an example external appearance of the rear surface side of the image capturing apparatus according to the first to fifth embodiments.

As illustrated in FIG. 2, for example, on the rear surface of the image capturing apparatus main body 12, a display 28, a cross key 30, a MENU/OK key 32, a BACK/DISP button 34, a viewfinder 36, and a touch panel 38 are provided.

The display 28 is, for example, an LCD (liquid crystal display) and displays an image obtained by image capturing of a photographic subject by the image capturing apparatus 10, text, and so on. The display 28 of this embodiment is an example of a display unit of the present disclosure. The display 28 of this embodiment and the touch panel 38 constitute a touch panel display 29. The display 28 is used to display a live preview image in the image capture mode. The live preview image is also called a through-image and is a series of frame images obtained by the imaging device 22 of the image capturing apparatus 10 performing image capturing of a photographic subject as a series of frames. In a case where a "captured image" is mentioned, the captured image may be a live preview image.

In a case where an instruction for still-image capturing is given, the display 28 is used to also display a still image obtained by single-frame image capturing. Further, the display 28 is used to also display a playback image in the playback mode, a menu screen, and so on.

On the surface of a display region of the display 28, the touch panel 38 of a transparent type is overlaid. The touch panel 38 senses, for example, a touch of an instructing object, such as a finger or a stylus pen. The touch panel 38 outputs, to a predetermined output destination (for example, a CPU (central processing unit) 74 described below, see FIG. 3), sensing result information indicating the sensing result, such as the presence or absence of a touch of an instructing object on the touch panel 38, at predetermined intervals of, for example, 100 milliseconds. In a case where the touch panel 38 senses a touch of an instructing object, the sensing result information includes two-dimensional coordinates (hereinafter referred to as "coordinates") with which the position at which the instructing object touches the touch panel 38 can be identified. In a case where the touch panel 38 does not sense a touch of an instructing object, the sensing result information does not include the coordinates.

The cross key 30 functions as a multifunction key for selecting one or more menus and for outputting instruction detail signals corresponding to various instructions including zooming, frame-by-frame playback, and so on. The MENU/OK key 32 is an operation key having both the function of a menu (MENU) button for giving an instruction for displaying one or more menus on the screen of the display 28 and the function of an accepting (OK) button for, for example, confirming a selection and giving an instruction for execution. The BACK/DISP button 34 is used in a case of, for example, erasing a desired target, such as a selected item, cancelling a specification, or returning to the previous operation state.

Figure 3:
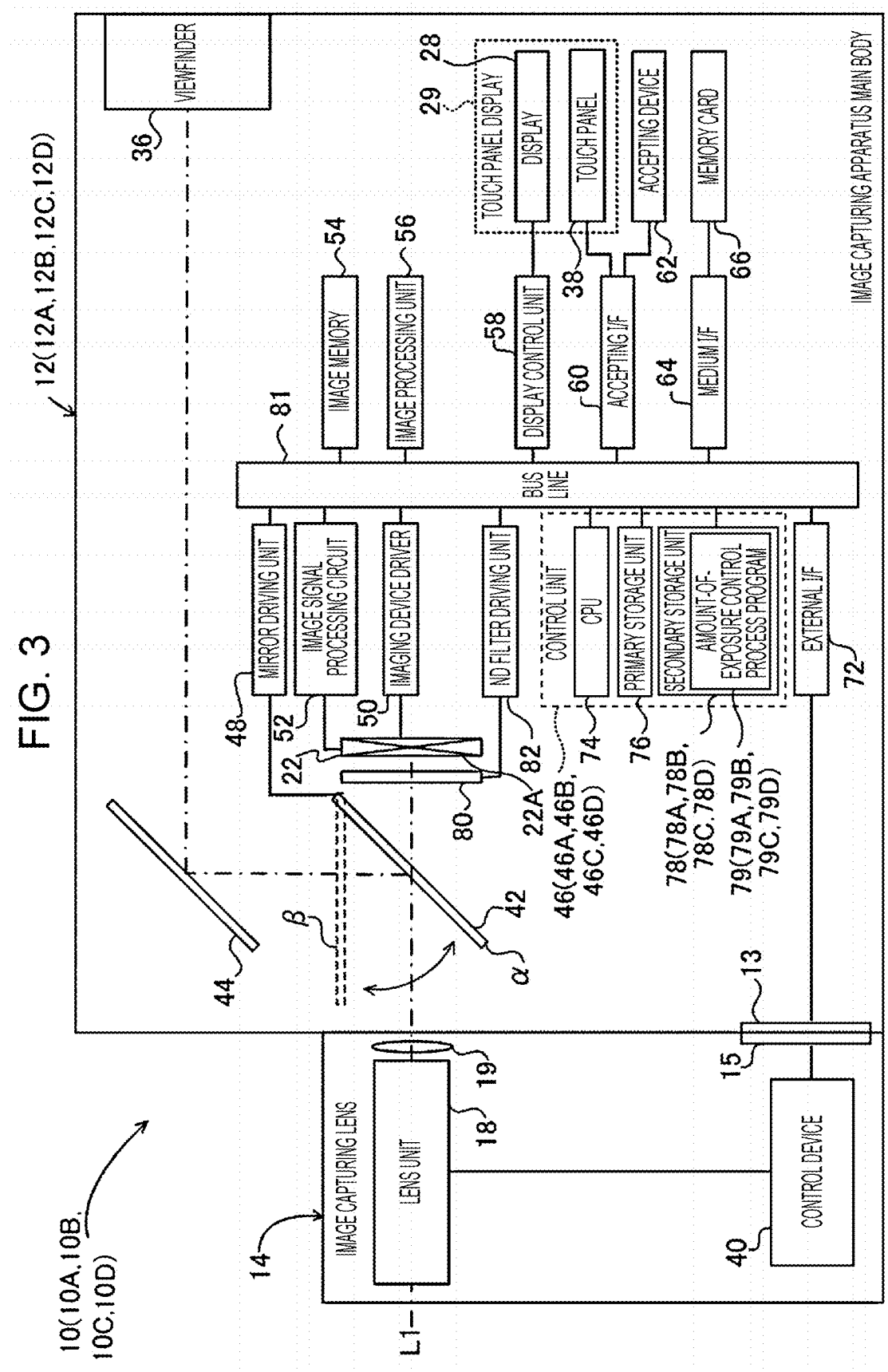
FIG. 3 is a block diagram illustrating an example hardware configuration of the image capturing apparatus according to the first to fifth embodiments.

FIG. 3 is a block diagram illustrating an example hardware configuration of the image capturing apparatus 10 according to the first embodiment.

As illustrated in FIG. 3, the image capturing apparatus main body 12 of this embodiment includes a mount 13 (see also FIG. 1), and the image capturing lens 14 includes a mount 15. In a case where the mount 15 is coupled with the mount 13, the image capturing lens 14 is attached to the image capturing apparatus main body 12 so as to be interchangeable.

The image capturing lens 14 includes the lens unit 18 described above, an aperture diaphragm 19, and a control device 40. In a case where the mount 15 is connected with the mount 13, the control device 40 is electrically connected to the CPU 74 through an external I/F (interface) 72 of the image capturing apparatus main body 12 to control the image capturing lens 14 as a whole in accordance with instructions from the CPU 74.

The aperture diaphragm 19 is provided on the image capturing apparatus main body 12 side relative to the lens unit 18. To the aperture diaphragm 19, a diaphragm driving unit and a diaphragm driving motor not illustrated are connected. The diaphragm driving unit is controlled by the control device 40 to operate the diaphragm driving motor in accordance with an instruction accepted by an accepting device 62 described below to adjust the size of the aperture of the aperture diaphragm 19, thereby adjusting the amount of photographic subject light that has passed through the lens unit 18 and guiding the photographic subject light into the image capturing apparatus main body 12.

As illustrated in FIG. 3, the image capturing apparatus main body 12 of this embodiment includes the imaging device 22, a first mirror 42, a second mirror 44, a control unit 46, a mirror driving unit 48, an imaging device driver 50, an image signal processing circuit 52, an image memory 54, an image processing unit 56, a display control unit 58, an ND (neutral density) filter 80, and an ND filter driving unit 82. The image capturing apparatus main body 12 further includes an accepting I/F 60, the accepting device 62, a medium I/F 64, and the external I/F 72.

The control unit 46 is an example of a computer in the technique of the present disclosure and includes the CPU 74, a primary storage unit 76, and a secondary storage unit 78. The CPU 74 controls the image capturing apparatus 10 as a whole. The primary storage unit 76 is a volatile memory that is used as a work area and so on in a case where various programs are executed. Examples of the primary storage unit 76 include a RAM (random access memory). The secondary storage unit 78 of this embodiment is a nonvolatile memory that stores in advance various programs including an amount-of-exposure control process program 79 described in detail below, various parameters, and so on. Examples of the secondary storage unit 78 include an EEPROM (electrically erasable programmable read-only memory) and a flash memory. The amount-of-exposure control process program 79 of this embodiment is an example of a control program of the present disclosure.

The CPU 74, the primary storage unit 76, and the secondary storage unit 78 are connected to a bus line 81. The mirror driving unit 48, the imaging device driver 50, the image signal processing circuit 52, and the ND filter driving unit 82 are also connected to the bus line 81. The image memory 54, the image processing unit 56, the display control unit 58, the accepting I/F 60, the medium I/F 64, and the external I/F 72 are also connected to the bus line 81.

The first mirror 42 is interposed between the photosensitive surface 22A of the imaging device 22 and the lens unit 18 and is a movable mirror that can be moved to a photosensitive surface cover position α and to a photosensitive surface open position β.

The first mirror 42 is connected to the mirror driving unit 48, and the mirror driving unit 48 is controlled by the CPU 74 to drive the first mirror 42 and place the first mirror 42 in the photosensitive surface cover position α or the photosensitive surface open position β in a selective manner. That is, in a case of not allowing the photosensitive surface 22A to receive photographic subject light, the first mirror 42 is placed in the photosensitive surface cover position α by the mirror driving unit 48, and in a case of allowing the photosensitive surface 22A to receive photographic subject light, the first mirror 42 is placed in the photosensitive surface open position β by the mirror driving unit 48.

In the photosensitive surface cover position α, the first mirror 42 covers the photosensitive surface 22A, and reflects and guides photographic subject light incoming from the lens unit 18 to the second mirror 44. The second mirror 44 reflects the photographic subject light guided by the first mirror 42 to thereby guide the photographic subject light to the viewfinder 36 through an optical system (not illustrated). The viewfinder 36 transmits the photographic subject light guided by the second mirror 44.

In the photosensitive surface open position β, the photosensitive surface 22A covered by the first mirror 42 is uncovered, and photographic subject light is received by the photosensitive surface 22A without reflected by the first mirror 42.

The ND filter 80 of this embodiment is an ND filter having a plurality of graduated light transmittances. For example, the ND filter 80 may have a plurality of continuous light transmittances. The ND filter 80 of this embodiment is placed between the first mirror 42 in the photosensitive surface cover position α and the imaging device 22 on the optical axis L1. The ND filter 80 is connected to the ND filter driving unit 82. The CPU 74 changes a voltage to be applied to the ND filter 80 from the ND filter driving unit 82 to thereby control the light transmittance of the ND filter 80 in accordance with a predetermined resolution. The CPU 74 thus controls the light transmittance of the ND filter 80 to thereby control the amount of exposure of the imaging device 22, more specifically, the amount of light that is incident on the imaging device 22 per unit time. The process in which the CPU 74 controls the light transmittance of the ND filter 80 to thereby control the amount of exposure of the imaging device 22 is called "ND filter process". The ND filter 80 and the ND filter driving unit 82 of this embodiment correspond to an example of an amount-of-light control unit of the present disclosure.

Specific examples of the ND filter 80 of this embodiment include an electrochromic element in which molecules undergo an oxidation-reduction reaction or enter a radical state in response to an applied voltage and the light transmittance reversibly changes and a liquid crystal shutter in which the orientations of molecules change in response to an applied voltage and the light transmittance reversibly changes; however, the specific examples are not limited to these. Specific examples of the liquid crystal shutter include a twisted nematic (TN) liquid crystal shutter and a guest-host (GH) liquid crystal shutter.

The imaging device driver 50 is connected to the imaging device 22. In this embodiment, a CCD (charge-coupled device) image sensor is used as the imaging device 22; however, the technique of the present disclosure is not limited to this. For example, another image sensor, such as a CMOS (complementary metal-oxide semiconductor) image sensor, may be used.

Figure 4:
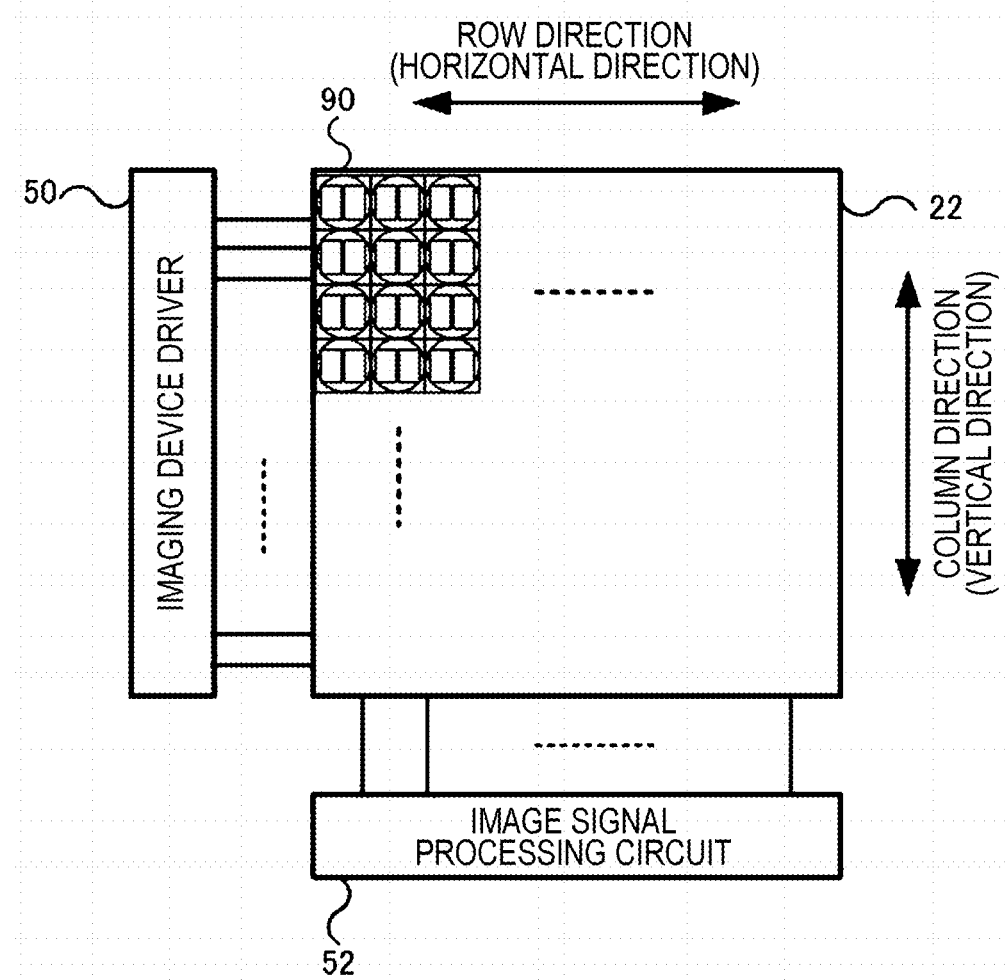
FIG. 4 is a diagram illustrating an example configuration of an imaging device according to the first to fifth embodiments.

In the imaging device 22 of this embodiment, for example, a plurality of pixels 90 are arranged in a two-dimensional array, as illustrated in FIG. 4. The number of pixels 90 and the number of rows and the number of columns of the array are not specifically limited. Each pixel 90 is driven in accordance with a vertical synchronizing signal output to the imaging device driver 50 from the CPU 74 and a horizontal synchronizing signal output to the image signal processing circuit 52, and exposure of the imaging device 22 is controlled.

Figure 5:
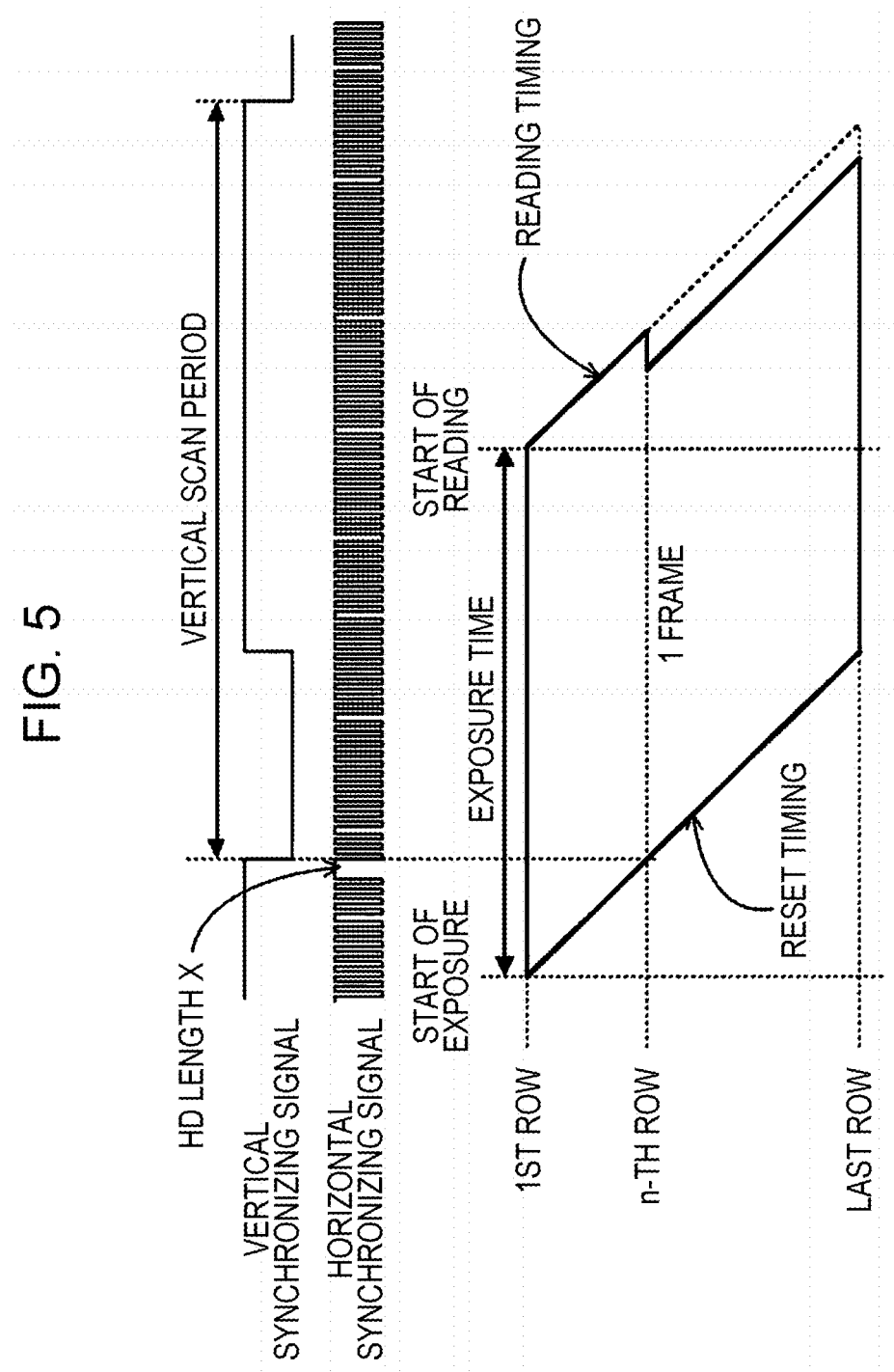
FIG. 5 is a diagram for explaining exposure time control in the image capturing apparatus according to the first to fifth embodiments.

In general, the exposure time of the imaging device 22 is controlled in accordance with the interval (hereinafter referred to as "HD length") of the scan period of the horizontal synchronizing signal. Therefore, in a case where the horizontal synchronizing signal includes an HD length X as illustrated in FIG. 5, the time during which electric charge is accumulated in the pixels 90 changes between the rows of the pixels 90 corresponding to pulses before and after the HD length X, that is, between the n-th row and the (n+1)-th row in the case illustrated in FIG. 5, the exposure time changes accordingly, and the exposure time becomes shorter in the (n+1)-th and the subsequent rows than in the rows up to the n-th row.

The CPU 74 of this embodiment changes the HD length of the horizontal synchronizing signal to be output to the image signal processing circuit 52 to thereby control the exposure time of the pixels 90 for each division region, the details of which will be described below, and control the amount of exposure of the pixels 90. The CPU 74 may control the exposure time of the pixels for each row of the array of the plurality of pixels.

The image signal processing circuit 52 reads an image signal for one frame from each pixel of the imaging device 22 in accordance with the horizontal synchronizing signal described above. The image signal processing circuit 52 performs various types of processing including correlative double sampling processing, automatic gain control, and A/D (analog/digital) conversion for the read image signals. The image signal processing circuit 52 outputs digitized image signals obtained as a result of various type of processing performed for the image signals to the image memory 54 on a per frame basis at a specific frame rate (for example, several tens of frames/sec.) defined by a clock signal supplied from the CPU 74.

The imaging device 22 and the imaging device driver 50 of this embodiment correspond to an example of an image capturing unit of the present disclosure.

The image memory 54 temporarily retains image signals input from the image signal processing circuit 52.

The image processing unit 56 obtains image signals from the image memory 54 at a specific frame rate on a per frame basis and performs various types of processing including gamma correction, brightness conversion, color difference conversion, and compression on the obtained image signals. The image processing unit 56 outputs image signals obtained as a result of various types of processing to the display control unit 58 at a specific frame rate on a per frame basis. Further, the image processing unit 56 outputs the image signals obtained as a result of various types of processing to the CPU 74 in response to a request from the CPU 74. The image processing unit 56 of this embodiment is an example of an image generation unit of the present disclosure.

The display control unit 58 is connected to the display 28 of the touch panel display 29 and is controlled by the CPU 74 to control the display 28. The display control unit 58 outputs image signals input from the image processing unit 56 to the display 28 at a specific frame rate on a per frame basis.

The display 28 displays an image represented by image signals input from the display control unit 58 at a specific frame rate as a live preview image. The display 28 also displays a still image, which is a single-frame image obtained by single-frame image capturing. On the display 28, a playback image, a menu screen, and so on are displayed in addition to a live preview image.

The accepting device 62 has the dial 24, the release button 26, the cross key 30, the MENU/OK key 32, the BACK/DISP button 34, and so on and accepts various instructions from the user. The accepting device 62 of this embodiment is an example of an accepting unit of the present disclosure.

The touch panel 38 of the touch panel display 29 and the accepting device 62 are connected to the accepting I/F 60 and output an instruction detail signal indicating the details of an accepted instruction to the accepting I/F 60. The accepting I/F 60 outputs the input instruction detail signal to the CPU 74. The CPU 74 performs a process corresponding to the instruction detail signal input from the accepting I/F 60.

To the medium I/F 64, a memory card 66 is connected so as to be detachable and re-attachable. The medium I/F 64 is controlled by the CPU 74 to record and read an image file to and from the memory card 66.

An image file read from the memory card 66 by the medium I/F 64 is subjected to decompression by the image processing unit 56 controlled by the CPU 74 and is displayed on the display 28 as a playback image.

In the image capturing apparatus 10, the operation mode is switched in accordance with an instruction accepted by the accepting device 62. In the image capturing apparatus 10, for example, in the image capture mode, the still-image capture mode and the moving-image capture mode are selectively set in accordance with an instruction accepted by the accepting device 62. In the still-image capture mode, a still-image file can be recorded to the memory card 66. In the moving-image capture mode, a moving-image file can be recorded to the memory card 66.

In a case where an instruction for capturing a still image given by using the release button 26 is accepted in the still-image capture mode, the CPU 74 controls the imaging device driver 50 to allow the imaging device 22 to be actually exposed for one frame. The image processing unit 56 is controlled by the CPU 74 to obtain image signals obtained as a result of the exposure for one frame, perform compression on the obtained image signals, and generate a still-image file in a specific still-image format. The specific still-image format may be, for example, the JPEG (Joint Photographic Experts Group) format. The still-image file is recorded to the memory card 66 through the medium I/F 64 by the image processing unit 56 controlled by the CPU 74.

In a case where an instruction for capturing a moving image given by using the release button 26 is accepted in the moving-image capture mode, the image processing unit 56 performs compression on image signals for a live preview image and generates a moving-image file in a specific moving-image format. The specific moving-image format may be, for example, the MPEG (Moving Picture Experts Group) format. The moving-image file is recorded to the memory card 66 through the medium I/F 64 by the image processing unit 56 controlled by the CPU 74.

Next, as the operations of the image capturing apparatus 10 of this embodiment, operations of the image capturing apparatus 10 to be performed in a case of performing an amount-of-exposure control process of this embodiment will be described.

In the image capturing apparatus 10 of this embodiment, in the image capture mode, a live preview image is displayed on the touch panel display 29 as described above. In the image capturing apparatus 10 of this embodiment, the amount-of-exposure control process for controlling the amount of exposure of the live preview image displayed on the touch panel display 29 is performed.

Figure 6:
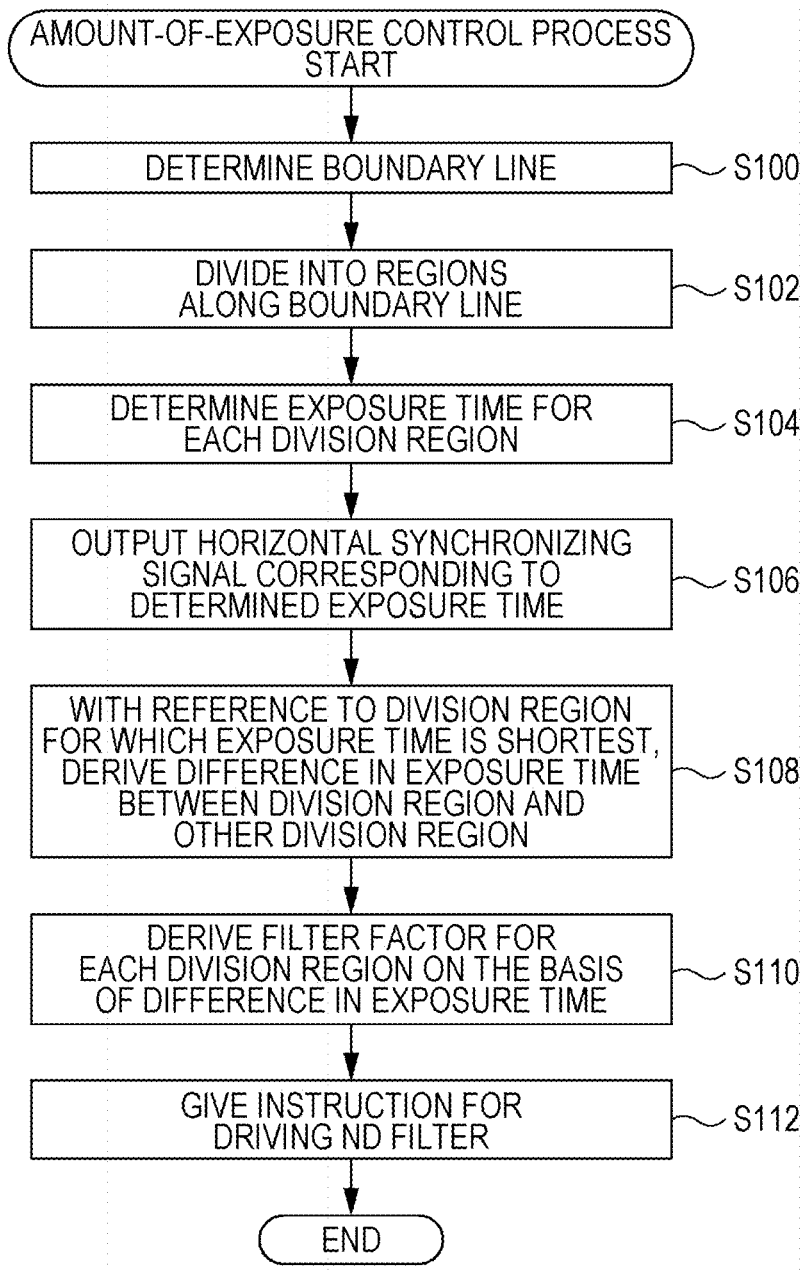
FIG. 6 is a flowchart illustrating an example flow of an amount-of-exposure control process according to the first embodiment.

Specifically, in a case where an instruction for performing long exposure or an instruction for performing short exposure is accepted by the accepting device 62 after a transition to the image capture mode, the CPU 74 of the image capturing apparatus 10 of this embodiment reads from the secondary storage unit 78, loads to the primary storage unit 76, and executes the amount-of-exposure control process program 79 to thereby perform the amount-of-exposure control process, an example of which is illustrated in FIG. 6. The CPU 74 executes the amount-of-exposure control process program 79 to thereby function as an example of a first control unit and a second control unit of the present disclosure.

Figure 7:
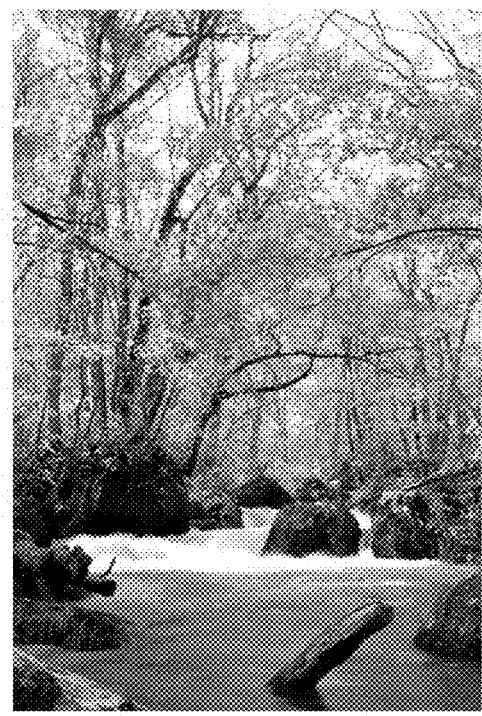
FIG. 7 is a diagram illustrating an example live preview image.

For convenience of description, a description is given below of a case where the amount-of-exposure control process is performed for a live preview image 100, an example of which is illustrated in FIG. 7, displayed on the touch panel display 29.

In the image capturing apparatus 10 of this embodiment, the amount of exposure is controlled for each of the plurality of division regions set by dividing the live preview image 100 along a boundary line. In other words, the CPU 74 of this embodiment controls the amount of exposure for each of the division regions obtained by dividing the live preview image 100 along a boundary line.

Figure 8:
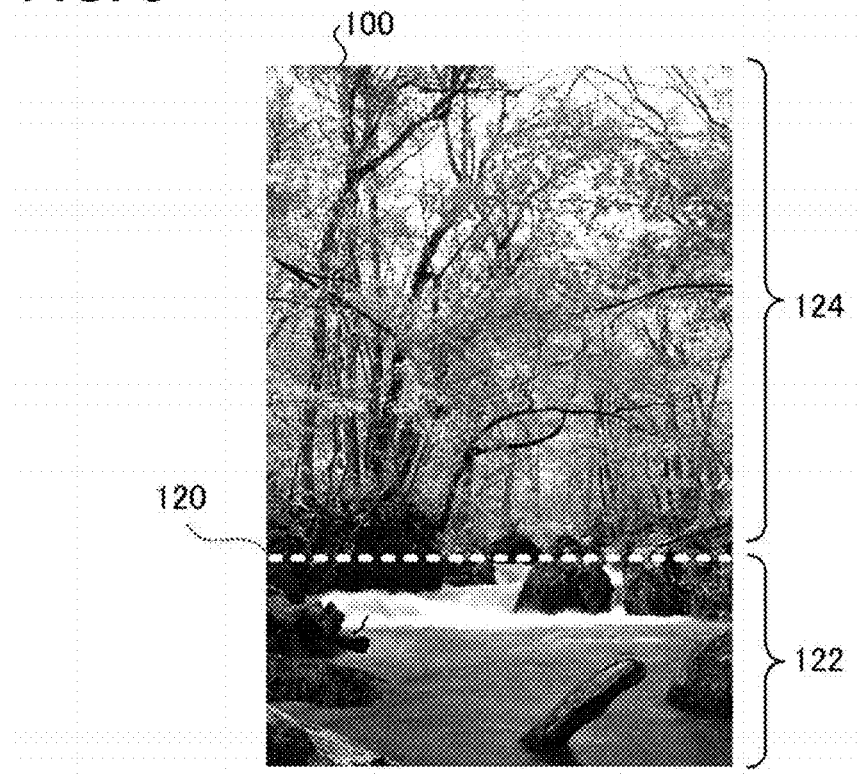
FIG. 8 is a diagram for explaining an example boundary line and example division regions derived from the live preview image illustrated in FIG. 7.

For this, first, in step S100 in FIG. 6, the CPU 74 performs an image analysis of the live preview image 100 and determines the position of a boundary line for setting regions for which the amount of exposure is controlled. FIG. 8 illustrates an example of a boundary line 120 determined for the live preview image 100.

The method for determining the position of the boundary line 120 by the CPU 74 is not specifically limited. For example, the CPU 74 may obtain coordinates indicating the position of the boundary line 120 specified by, for example, the user tracing the live preview image 100 displayed on the touch panel display 29 with their fingertip or the like and determine the boundary line 120 on the basis of the obtained coordinates.

Figure 9:
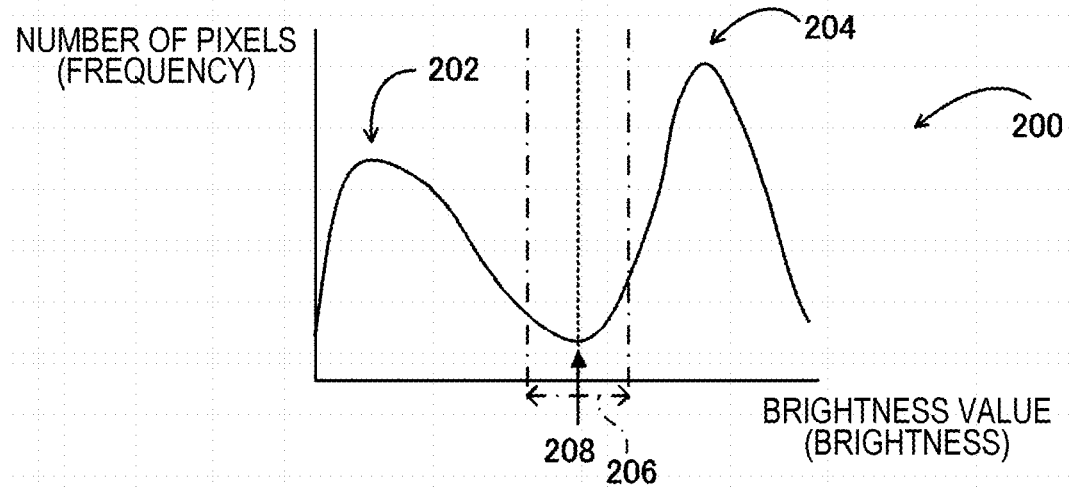
FIG. 9 is a diagram illustrating an example histogram of the live preview image.

As the method for determining the boundary line, a form in which the CPU 74 automatically determines the boundary line on the basis of the live preview image 100 may be employed. For example, the CPU 74 may determine the position of the boundary line on the basis of a histogram (brightness distribution) obtained as a result of image analysis of the live preview image 100. For example, a histogram 200 of the live preview image 100 is illustrated in FIG. 9. The histogram 200 illustrated in FIG. 9 represents the brightness distribution of the live preview image 100, where the horizontal axis represents the brightness value (brightness) and the vertical axis represents the number of pixels (frequency). Hereinafter, "brightness value" may be simply referred to as "brightness".

The CPU 74 detects a range 206 that corresponds to a valley between a peak 202 and a peak 204 of the brightness value from the histogram 200 and determines one specific brightness value 208 in the detected range 206 on the basis of a predetermined condition. In the predetermined condition in this case, for example, the intermediate value in the range 206 or a brightness value for which the number of pixels is smallest is specified as the brightness value to be determined. On the basis of the positions of pixels corresponding to the determined brightness value 208, the CPU 74 needs to set a straight line that includes the largest number of pixels having a brightness value equal to the brightness value 208 as the boundary line 120 in the live preview image 100 to thereby determine the position of the boundary line 120 in the live preview image 100.

The case has been described where the histogram 200 illustrated in FIG. 9 has two portions (the peak 202 and the peak 204) that correspond to peaks of the brightness value; however, even in a case where the histogram 200 has three or more portions that correspond to peaks of the brightness value, that is, has two or more ranges 206 that correspond to valleys, the CPU 74 can determine the position of the boundary line 120 from the histogram. In this case, for example, the CPU 74 needs to determine, from among brightness values determined from the respective ranges 206 that correspond to the plurality of valleys, a brightness value that meets a predetermined condition specifying, for example, the smallest value, and determine the position of the boundary line 120 on the basis of the determined brightness value.

Another method for determining the position of the boundary line 120 may be employed in which contrasts are sequentially extracted from an end portion of the live preview image 100 on the basis of the brightness or density, and a position in which the contrast suddenly changes is determined to be the position of the boundary line 120.

In the next step S102, the CPU 74 divides the live preview image 100 into a plurality of division regions along the boundary line 120 that has been determined. FIG. 8 illustrates an example state where the live preview image 100 is divided into a division region 122 and a division region 124 along the boundary line 120. The division region 122 corresponds to a region that includes the 0-th row to the m-th row of the pixels 90, and the division region 124 corresponds to a region that includes the (m+1)-th row to the n-th row of the pixels 90.

Figure 10:
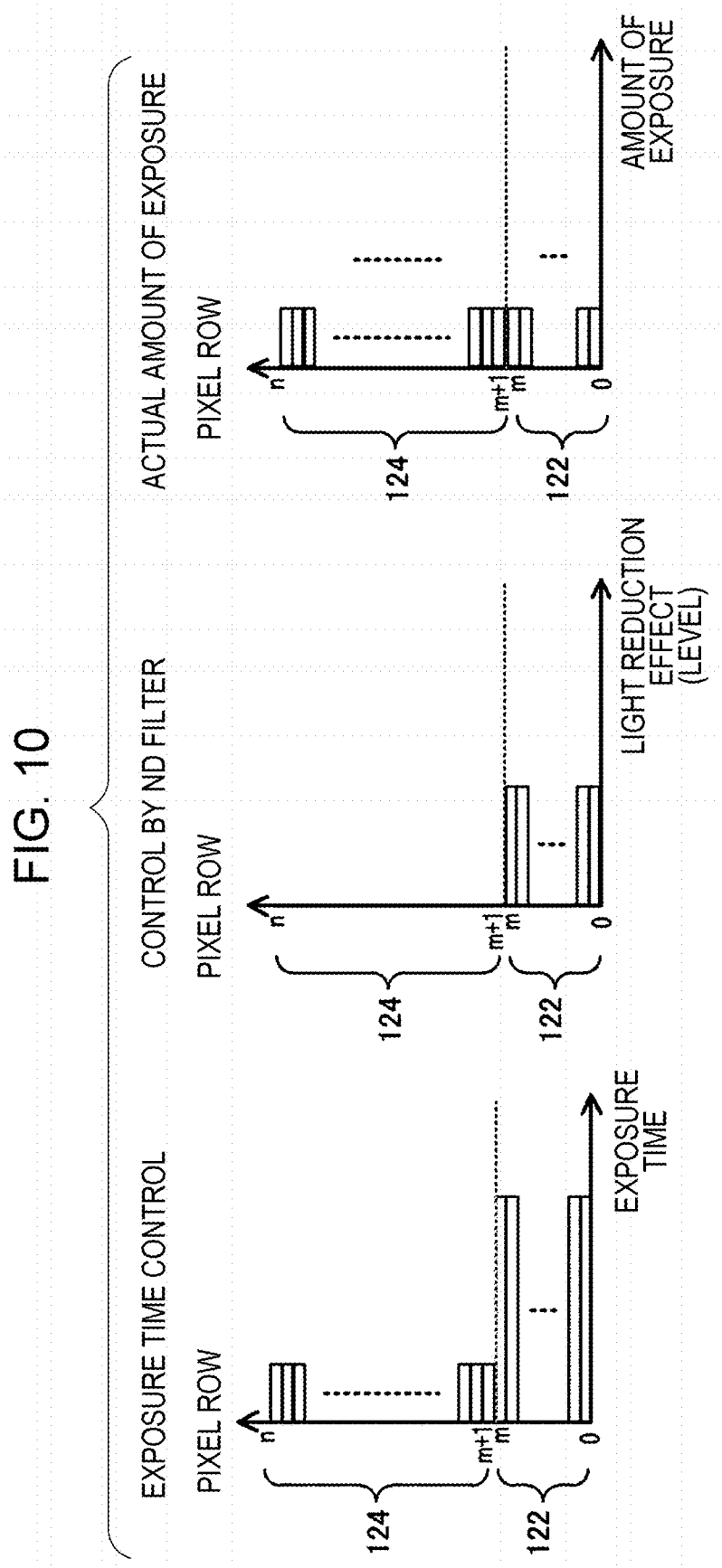
FIG. 10 includes diagrams for explaining an exposure time, a light reduction effect by an ND filter, and an amount of exposure.

In the next step S104, the CPU 74 determines the exposure time for each division region. Specifically, in order to set an exposure time desired by the user, the CPU 74 accepts through the accepting device 62 an exposure time specified by the user for each division region and determines the accepted exposure time to be the exposure time for the division region. For example, in the live preview image 100 illustrated in FIG. 8, for the division region 122, the user specifies a relatively long exposure time sufficient to record trails so that the flowing water (river) leaves trails in the image. On the other hand, for the division region 124, the user specifies an exposure time shorter than that for the division region 122 so that trails of the trees, leaves, and so on that sway in the wind are not expressed as blurring. FIG. 10 illustrates an example exposure time for the division region 122 and that for the division region 124 as "exposure time control".

In the next step S106, the CPU 74 outputs the horizontal synchronizing signal that corresponds to the determined exposure time. In this embodiment, as the HD length X is longer, the exposure time becomes shorter, and as the HD length X is shorter, the exposure time becomes longer. In this embodiment, a correspondence between the HD length X and the exposure time is stored in advance in the secondary storage unit 78, and the CPU 74 derives the HD length X that corresponds to the exposure time on the basis of the correspondence stored in the secondary storage unit 78. The CPU 74 outputs the horizontal synchronizing signal that includes the derived HD length X to the image signal processing circuit 52.

It is preferable to perform control for the pixels 90 so that the exposure duration for the pixels 90 for which short exposure is performed is included in the exposure duration for the pixels 90 for which long exposure is performed. For example, the CPU 74 may perform control so that the timing at which exposure starts is the same, may perform control so that the timing at which exposure ends is the same, or may perform control so that the timing that corresponds to the center of the exposure duration is the same.

In the next step S108, with reference to a division region for which the exposure time is shortest, the CPU 74 derives the difference in exposure time between the division region and the other division region. The example of the live preview image 100 illustrated in FIG. 8 includes two division regions, namely, the division region 122 and the division region 124, and the division region 124 is shorter in exposure time. Therefore, with reference to the exposure time of the division region 124, the CPU 74 derives the difference in exposure time between the division region 124 and the division region 122. In the case of the live preview image 100, the exposure time of the division region 122 is longer than that of the division region 124, and therefore, the amount of exposure of the division region 122 is larger than that of the division region 124.

In the next step S110, the CPU 74 derives a filter factor (a level that indicates a light reduction effect) for performing the ND filter process for the ND filter 80 for each division region, on the basis of the difference in exposure time derived in step S108.

As described above, the amount of exposure of the division region 122 and the amount of exposure of the division region 124 are different from each other, and therefore, the CPU 74 performs the ND filter process so as to make the amount of exposure of the entire live preview image 100 homogeneous. The state where the amount of exposure is "homogeneous" includes a state where the amounts of exposure completely match each other and a state where the difference between the amounts of exposure is within a range determined in advance in accordance with an error, the resolution (level) of the light transmittance of the ND filter 80, the resolution of the exposure time, and so on.

Specifically, for the division region 122 for which the exposure time is long and the amount of exposure is large, the light transmittance is made lower to enhance the light reduction effect of the ND filter 80, thereby making the amount of exposure of the division region 122 be equivalent to the amount of exposure of the division region 124. Accordingly, the amount of exposure of the entire live preview image 100 is made homogeneous. In the example illustrated as "control by ND filter" in FIG. 10, light reduction by the ND filter 80 is not performed for the division region 124. That is, the light transmittance is set to 100%. Therefore, the actual amount of exposure of the division region 124 obtained as a result of combination of exposure time control and control by the ND filter 80 is not affected by the ND filter 80 and is equivalent to the amount of exposure based on the exposure time.

On the other hand, for the division region 122, light reduction by the ND filter 80 is performed to make the light transmittance lower. Accordingly, as illustrated in FIG. 10 as "actual amount of exposure", the actual amount of exposure of the division region 122 obtained as a result of combination of exposure time control and control by the ND filter 80 is affected by the ND filter 80 and is equivalent to the actual amount of exposure of the division region 124.

For this, the CPU 74 derives a filter factor for performing the ND filter process for the ND filter 80 for each division region on the basis of the difference in exposure time. The specific deriving method is not specifically limited. For example, information indicating a correspondence between the difference in exposure time and the filter factor may be stored in advance in the secondary storage unit 78, and the CPU 74 may derive a filter factor corresponding to the derived difference in exposure time from the information indicating the correspondence and stored in the secondary storage unit 78 as the filter factor corresponding to the division region 122.

In the next step S112, the CPU 74 outputs to the ND filter driving unit 82 an instruction for driving the ND filter 80 in accordance with the filter factor of the ND filter 80 derived in step S110 described above, and thereafter, the amount-of-exposure control process ends.

Accordingly, the live preview image 100 displayed on the touch panel display 29 becomes an image obtained by the CPU 74 controlling the amount of exposure. In a case where an instruction for image capturing is given by the user using the release button 26, a captured image obtained by the imaging device 22 in a state where the amount of exposure is controlled by the CPU 74 is recorded to the memory card 66.

As described above, in the image capturing apparatus 10 of this embodiment, the CPU 74 controls the exposure time for each of the division regions (division region 122 and division region 124) and makes the light transmittance for a division region (division region 122), for which the exposure time is long, lower than the light transmittance for a division region (division region 124) for which the exposure time is shortest with the ND filter 80 to thereby eliminate the difference in amount of exposure between the division regions caused by the difference in exposure time.

Therefore, with the image capturing apparatus 10 of this embodiment, a captured image in which both the effect of long exposure and the effect of short exposure coexist can be obtained.

Figure 11:
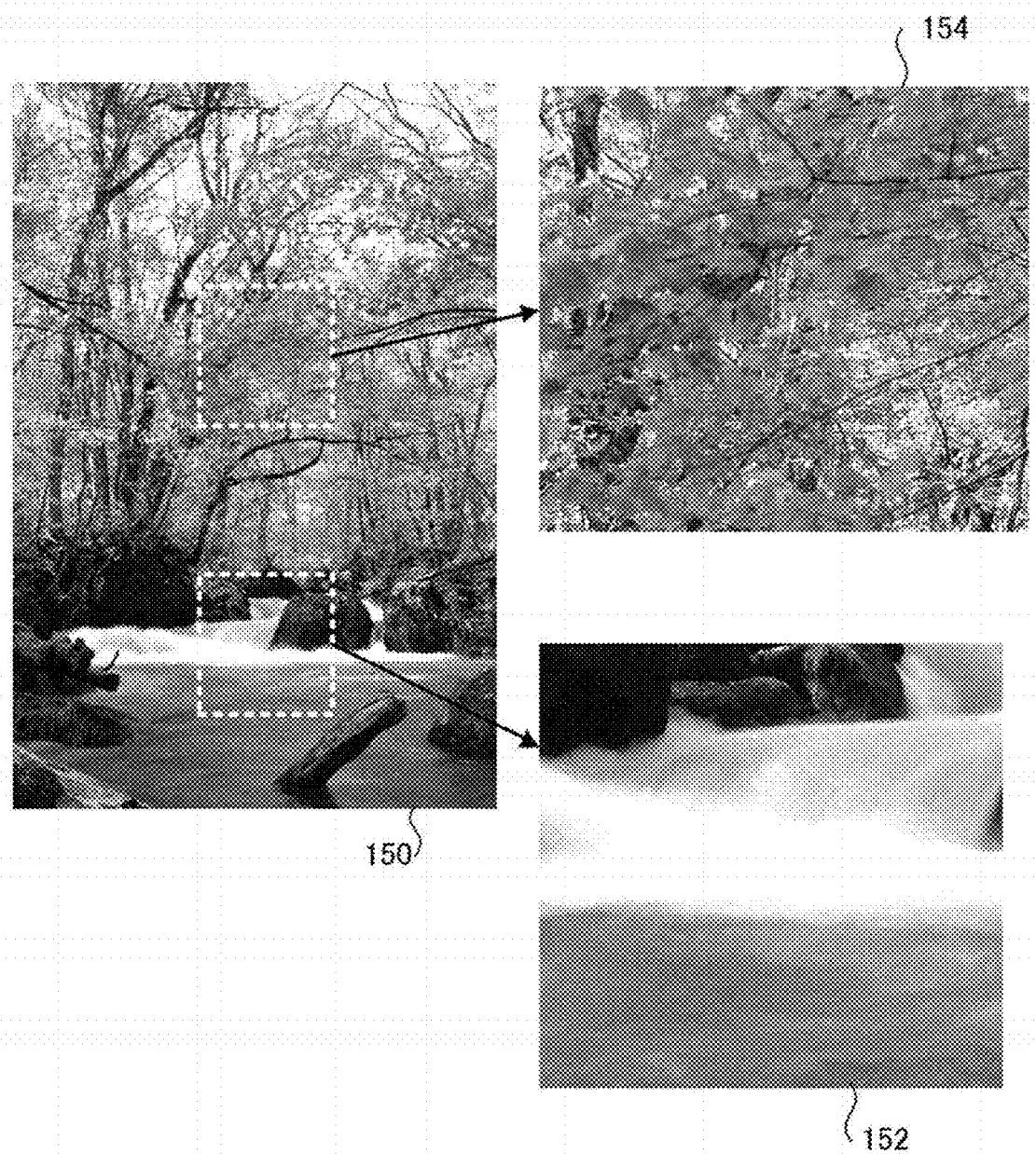
FIG. 11 is a diagram illustrating an example captured image captured by the image capturing apparatus according to the first embodiment.

As a result of performing the amount-of-exposure control process described above in the image capturing apparatus 10 of this embodiment, a live preview image 150 illustrated in FIG. 11 is displayed on the touch panel display 29. As illustrated in FIG. 11, a partial image 152 of the live preview image 150 corresponding to the division region 122 is an image in which trails of flowing water are present due to the effect of long exposure. In a partial image 154 of the live preview image 150 corresponding to a portion of the division region 124, unwanted trails of swaying leaves and so on are not present due to the effect of short exposure, and the image of the photographic subject (leaves and so on) is not blurred. That is, the live preview image 150 illustrated in FIG. 11 is a captured image in which both the effect of long exposure and the effect of short exposure coexist, and an image that achieves an expression desired by the user is obtained.

On the other hand, for a comparison with the image capturing apparatus 10 of this embodiment, unlike in the image capturing apparatus 10 of this embodiment, in a case of making the exposure time of the entire captured image be the same, an image that achieves an expression desired by the user is not obtained.

Figure 12:
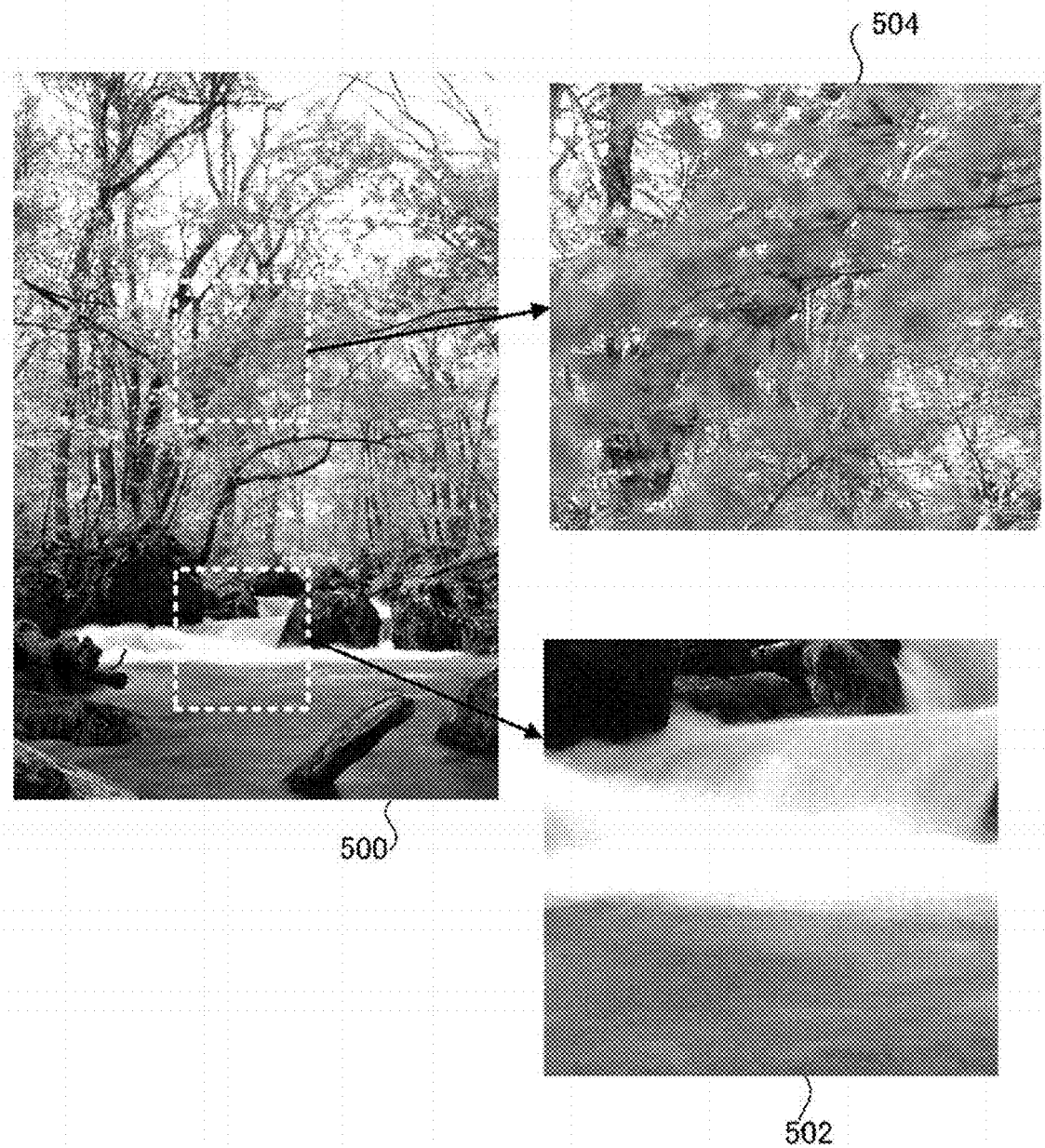
FIG. 12 is a diagram illustrating an example captured image that is a comparative example in a case where long exposure is applied to the entire image.

For example, FIG. 12 illustrates an example live preview image 500 in a case where the exposure time of the division region 124 is made to match the exposure time of the division region 122 described above. That is, the live preview image 500 corresponds to a case where long exposure is applied to the entire image. As illustrated in FIG. 12, a partial image 502 of the live preview image 500 corresponding to the division region 122 is an image in which trails of flowing water are present due to the effect of long exposure. On the other hand, in a partial image 504 of the live preview image 500 corresponding to the division region 124, unwanted trails of swaying leaves and so on are present, and the image of the photographic subject (leaves and trees) is blurred. Accordingly, an image that achieves an expression desired by the user is not obtained.

Figure 13:
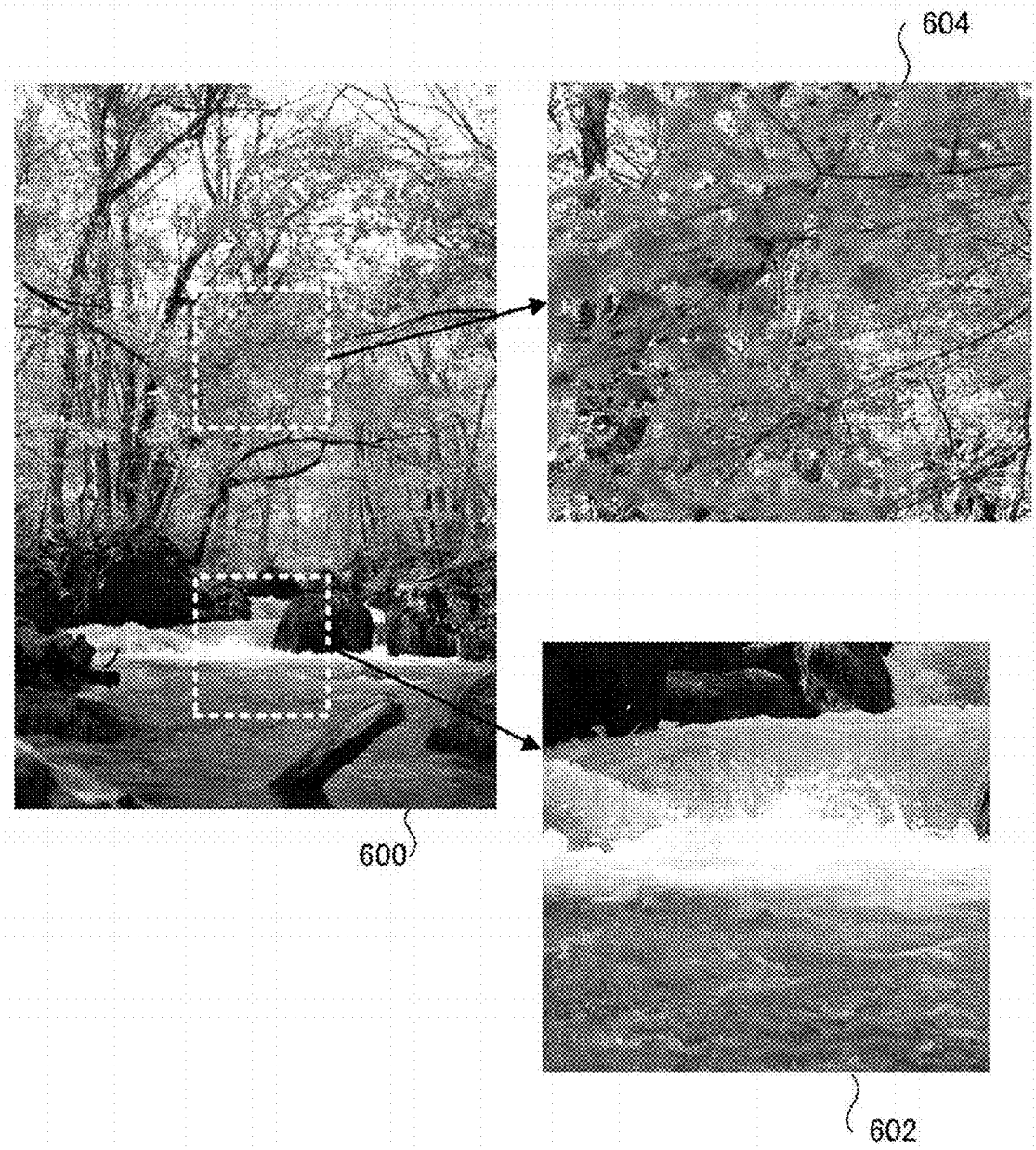
FIG. 13 is a diagram illustrating an example captured image that is a comparative example in a case where short exposure is applied to the entire image.

For example, FIG. 13 illustrates an example live preview image 600 in a case where the exposure time of the division region 122 is made to match the exposure time of the division region 124 described above. That is, the live preview image 600 corresponds to a case where short exposure is applied to the entire image. As illustrated in FIG. 13, in a partial image 604 of the live preview image 600 corresponding to a portion of the division region 124, unwanted trails of swaying leaves and so on are not present due to the effect of short exposure, and the image of the photographic subject (leaves and so on) is not blurred. On the other hand, a partial image 602 of the live preview image 600 corresponding to a portion of the division region 122 is an image in which desired trails of flowing water are not present. Accordingly, an image that achieves an expression desired by the user is not obtained.

Second Embodiment

A second embodiment will be described in detail below. In this embodiment, components the same as those described in the first embodiment described above are assigned the same reference numerals, and descriptions thereof will be omitted.

For example, as illustrated in FIG. 1 to FIG. 3, an image capturing apparatus 10A of this embodiment is different from the image capturing apparatus 10 of the first embodiment described above in that the image capturing apparatus 10A has an image capturing apparatus main body 12A instead of the image capturing apparatus main body 12.

For example, as illustrated in FIG. 3, the image capturing apparatus main body 12A is different from the image capturing apparatus main body 12 in that the image capturing apparatus main body 12A has a control unit 46A instead of the control unit 46. The control unit 46A is different from the control unit 46 in that the control unit 46A has a secondary storage unit 78A instead of the secondary storage unit 78.

For example, as illustrated in FIG. 3, the secondary storage unit 78A is different from the secondary storage unit 78 in that the secondary storage unit 78A stores an amount-of-exposure control process program 79A instead of the amount-of-exposure control process program 79. The CPU 74 reads from the secondary storage unit 78A and loads to the primary storage unit 76 the amount-of-exposure control process program 79A, and performs an amount-of-exposure control process illustrated in FIG. 14 in accordance with the loaded amount-of-exposure control process program 79A. The CPU 74 executes the amount-of-exposure control process program 79A to thereby operate as an example of the first control unit, the second control unit, and a determination unit of the present disclosure.

Now, as the operations of the image capturing apparatus 10A of this embodiment, the amount-of-exposure control process illustrated in FIG. 14 will be described. For an operation the same as that in the first embodiment described above, a description thereof will be omitted.

Figure 14:
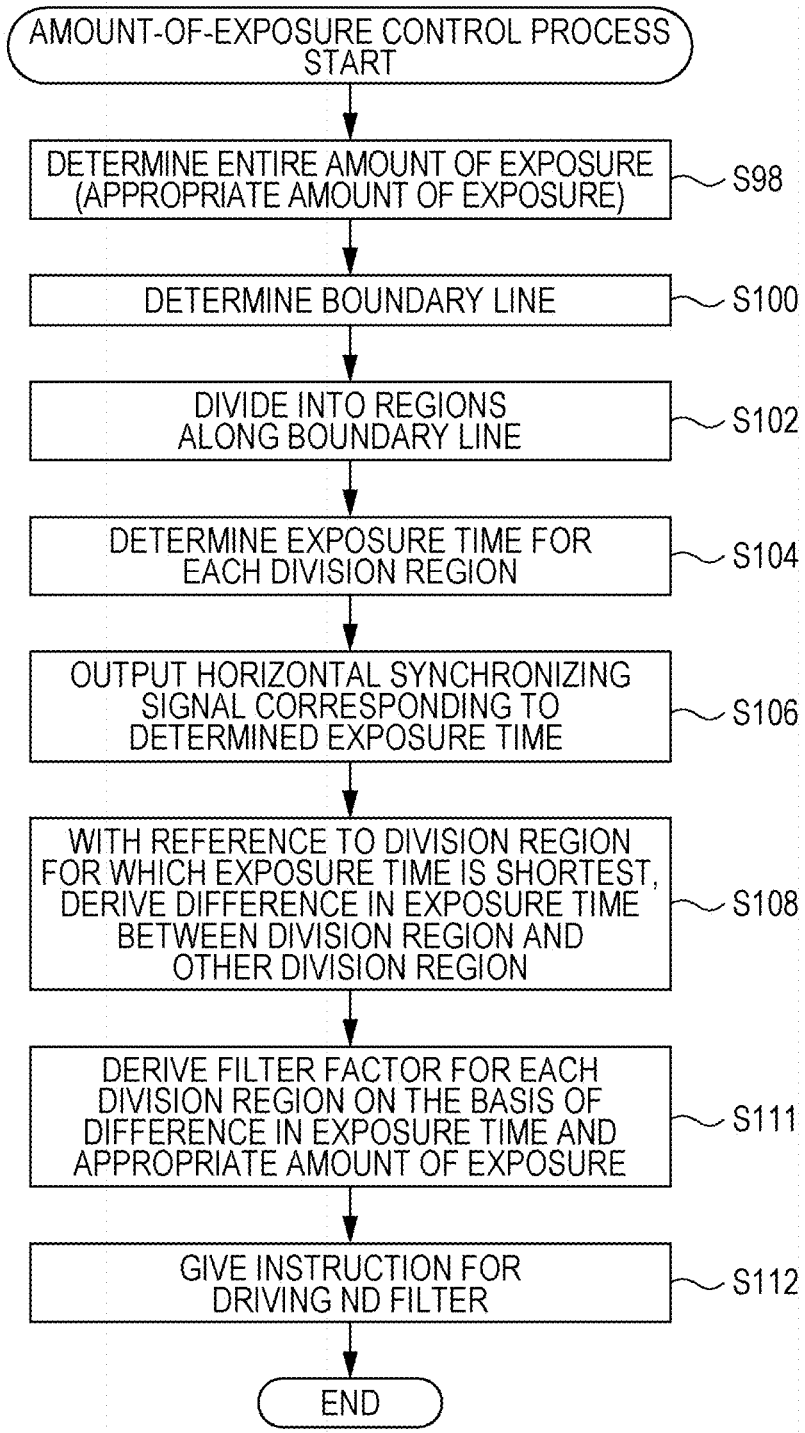
FIG. 14 is a flowchart illustrating an example flow of an amount-of-exposure control process according to the second embodiment.

As illustrated in FIG. 14, in this embodiment, a difference from the amount-of-exposure control process (see FIG. 6) of the first embodiment is that the process in step S98 is performed before step S100 and the process in step S111 is performed instead of the process in step S110.

As illustrated in FIG. 14, in this embodiment, in a case where performing of the amount-of-exposure control process starts, first, in step S98, the CPU 74 determines the amount of exposure of the entire live preview image 100 (captured image). The amount of exposure of the entire live preview image 100 determined here is the final amount of exposure (hereinafter referred to as "appropriate amount of exposure") of the captured image. In this embodiment, a desired amount of exposure specified by the user is accepted by the accepting device 62, and the accepted amount of exposure is determined to be the appropriate amount of exposure. The method for determining the appropriate amount of exposure is not specifically limited. For example, the CPU 74 may determine the appropriate amount of exposure on the basis of the result of image analysis performed for the live preview image 100.

In step S111, the CPU 74 derives a filter factor (a level that indicates a light reduction effect) for performing the ND filter process for the ND filter 80 for each division region, on the basis of the difference in exposure time derived in step S108 described above and the appropriate amount of exposure determined in step S98 described above.

As described above, with the image capturing apparatus 10A of this embodiment, the CPU 74 performs control to set the amount of exposure for the entire captured image as the appropriate amount of exposure in the ND filter process, and therefore, an image that achieves an expression desired by the user is obtained to a larger degree.

Third Embodiment

A third embodiment will be described in detail below. In this embodiment, components the same as those described in the first embodiment described above are assigned the same reference numerals, and descriptions thereof will be omitted.

For example, as illustrated in FIG. 1 to FIG. 3, an image capturing apparatus 10B of this embodiment is different from the image capturing apparatus 10 of the first embodiment described above in that the image capturing apparatus 10B has an image capturing apparatus main body 12B instead of the image capturing apparatus main body 12.

For example, as illustrated in FIG. 3, the image capturing apparatus main body 12B is different from the image capturing apparatus main body 12 in that the image capturing apparatus main body 12B has a control unit 46B instead of the control unit 46. The control unit 46B is different from the control unit 46 in that the control unit 46B has a secondary storage unit 78B instead of the secondary storage unit 78.

For example, as illustrated in FIG. 3, the secondary storage unit 78B is different from the secondary storage unit 78 in that the secondary storage unit 78B stores an amount-of-exposure control process program 79B instead of the amount-of-exposure control process program 79. The CPU 74 reads from the secondary storage unit 78B and loads to the primary storage unit 76 the amount-of-exposure control process program 79B, and performs an amount-of-exposure control process illustrated in FIG. 15 in accordance with the loaded amount-of-exposure control process program 79B. The CPU 74 executes the amount-of-exposure control process program 79B to thereby operate as an example of the first control unit, the second control unit, a third control unit, and the determination unit of the present disclosure.

Now, as the operations of the image capturing apparatus 10B of this embodiment, the amount-of-exposure control process illustrated in FIG. 15 will be described. For an operation the same as that in the first embodiment described above, a description thereof will be omitted.

Figure 15:
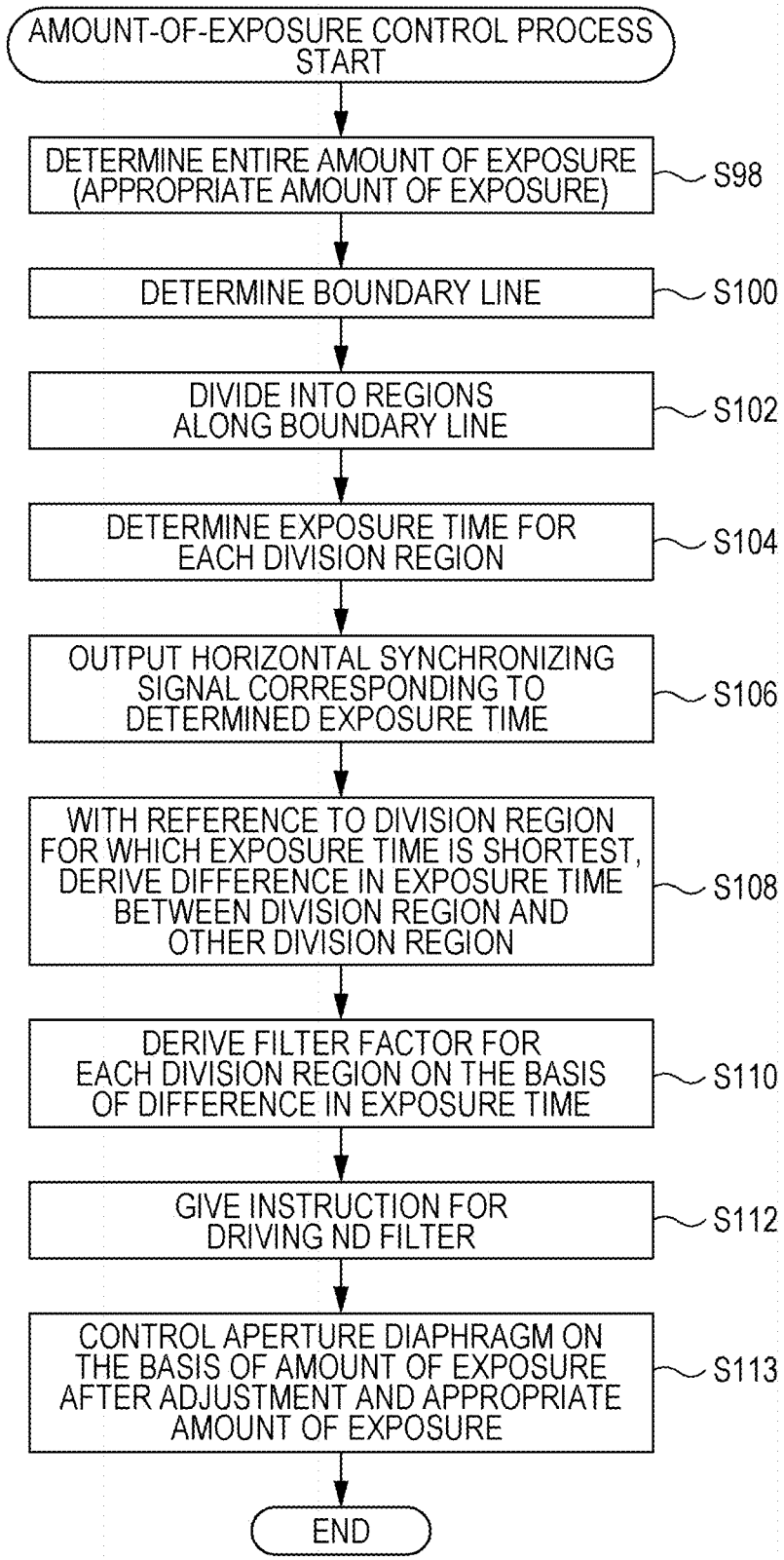
FIG. 15 is a flowchart illustrating an example flow of an amount-of-exposure control process according to the third embodiment.

As illustrated in FIG. 15, in this embodiment, a difference from the amount-of-exposure control process (see FIG. 6) of the first embodiment is that the process in step S98 is performed before step S100 and the process in step S113 is performed after step S112.

The process in step S98 is similar to that in the amount-of-exposure control process (see FIG. 14) of the second embodiment, and therefore, a description thereof will be omitted.

As illustrated in FIG. 15, in step S113, the CPU 74 controls the size of the aperture of the aperture diaphragm 19 with the diaphragm driving unit not illustrated on the basis of the appropriate amount of exposure and the amount of exposure obtained after adjustment of the difference in amount of exposure between the division region 122 and the division region 124 by exposure time control in the process in step S106 described above and control by the ND filter 80 in step S112 described above.

As described above, in the image capturing apparatus 10B of this embodiment, the CPU 74 controls the size of the aperture of the aperture diaphragm 19 to thereby perform control so that the amount of exposure of the entire captured image is the appropriate amount of exposure. Therefore, an image that achieves an expression desired by the user is obtained to a larger degree.

Fourth Embodiment

A fourth embodiment will be described in detail below. In this embodiment, components the same as those described in the first embodiment described above are assigned the same reference numerals, and descriptions thereof will be omitted.

For example, as illustrated in FIG. 1 to FIG. 3, an image capturing apparatus 10C of this embodiment is different from the image capturing apparatus 10 of the first embodiment described above in that the image capturing apparatus 10C has an image capturing apparatus main body 12C instead of the image capturing apparatus main body 12.

For example, as illustrated in FIG. 3, the image capturing apparatus main body 12C is different from the image capturing apparatus main body 12 in that the image capturing apparatus main body 12C has a control unit 46C instead of the control unit 46. The control unit 46C is different from the control unit 46 in that the control unit 46C has a secondary storage unit 78C instead of the secondary storage unit 78.

For example, as illustrated in FIG. 3, the secondary storage unit 78C is different from the secondary storage unit 78 in that the secondary storage unit 78C stores an amount-of-exposure control process program 79C instead of the amount-of-exposure control process program 79. The CPU 74 reads from the secondary storage unit 78C and loads to the primary storage unit 76 the amount-of-exposure control process program 79C, and performs an amount-of-exposure control process illustrated in FIG. 16 in accordance with the loaded amount-of-exposure control process program 79C. The CPU 74 executes the amount-of-exposure control process program 79C to thereby operate as the first control unit, the second control unit, a dividing unit, and an exposure time determination unit of the present disclosure.

Now, as the operations of the image capturing apparatus 10C of this embodiment, the amount-of-exposure control process illustrated in FIG. 16 will be described. For an operation the same as that in the first embodiment described above, a description thereof will be omitted.

In the amount-of-exposure control process that is performed in the image capturing apparatus 10C of this embodiment, the method for determining the division region 122 and the division region 124 (the method for determining the boundary line 120) and the method for determining the exposure time for the division region 122 and that for the division region 124 are different from those in the above-described embodiments.

Figure 16:
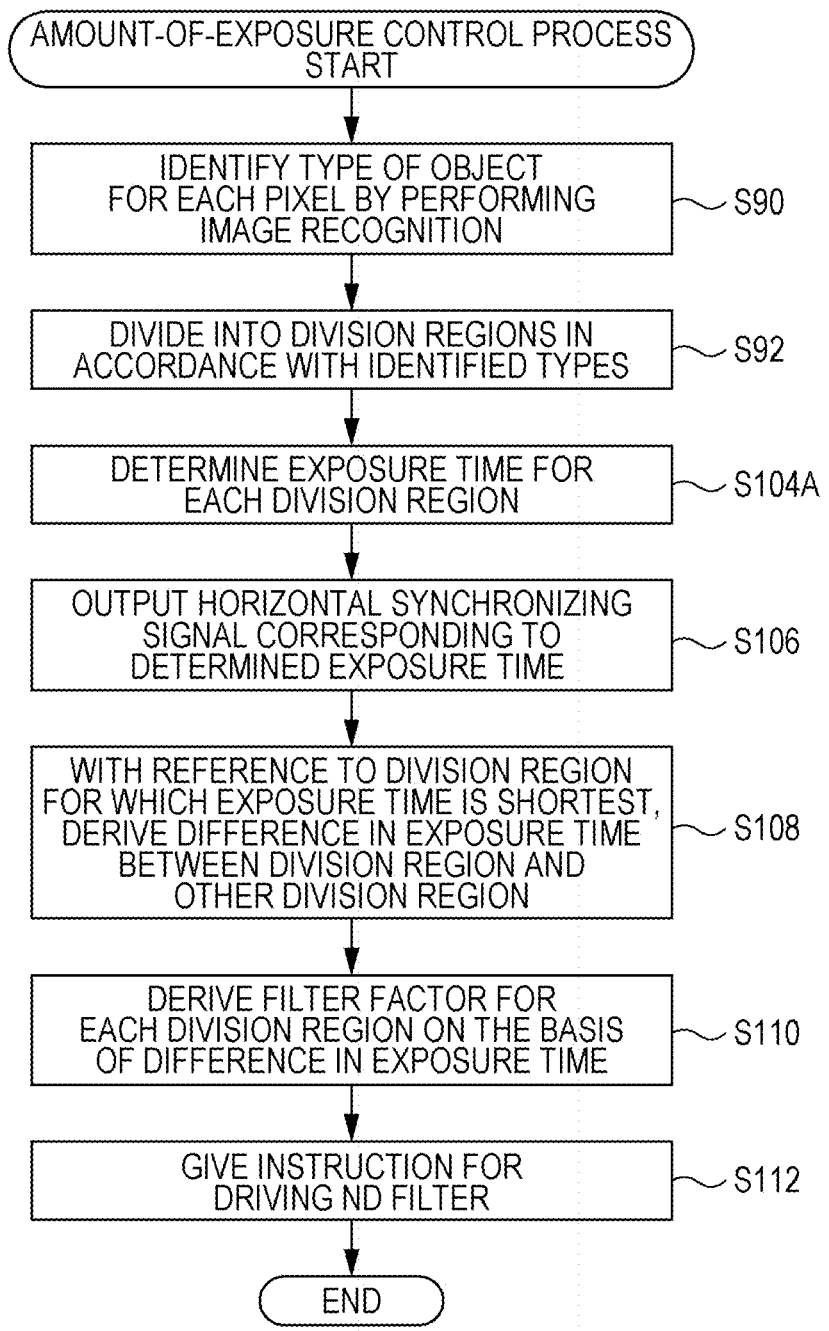
FIG. 16 is a flowchart illustrating an example flow of an amount-of-exposure control process according to the fourth embodiment.

Accordingly, as illustrated in FIG. 16, the amount-of-exposure control process of this embodiment is different from the amount-of-exposure control process (see FIG. 6) of the first embodiment described above in that the process in step S90 and step S92 is performed instead of the process in step S100 and step S102 and the process in step S104A is performed instead of the process in step S104. In this embodiment, for convenience of description, a description is given below of a case where the amount-of-exposure control process is performed for a live preview image 130, an example of which is illustrated in FIG. 17, displayed on the touch panel display 29.

As illustrated in FIG. 16, in this embodiment, in a case where performing of the amount-of-exposure control process starts, first, in step S90, the CPU 74 performs an image recognition process for the live preview image 130 to identify the types of objects, which are photographic subjects and so on, included in the live preview image 130. The types of objects each represent a target for which the exposure time is controlled so that an image of the object becomes an image desired by the user. The types of objects are not specifically limited, and any type may be set. Examples of the types of objects include "water", "rock", "tree", and "sky".

The method for the CPU 74 to identify the types of objects, which are photographic subjects and so on, included in the live preview image 130 by performing the image recognition process is not specifically limited. For example, a neural network that undergoes learning with a plurality of pieces of image data may be used to identify the object of each pixel of the live preview image 130. In this embodiment, for each pixel of the live preview image 130, a corresponding type of object is identified; however, not for each pixel but for each region obtained by dividing the live preview image 130 into regions of a predetermined size, a corresponding type of object may be identified. Alternatively, an image recognition process may be performed to extract photographic subjects included in the live preview image 130, and a type of object may be identified for each extracted photographic subject by performing an image recognition process.

FIG. 18 illustrates an example identification result of identifying the types of objects, which are photographic subjects and so on, included in the live preview image 130. The example in FIG. 18 illustrates an identification result of identifying four types of objects, namely, "water", "rock", "tree", and "sky", from the live preview image 130.

In the next step S92, the CPU 74 divides the live preview image 130 into a plurality of division regions in accordance with the identified types of objects. The division method for dividing the live preview image 130 by the CPU 74 is not specifically limited. For example, the CPU 74 may perform division on the basis of the type, size, position, and so on of each identified object. In the example illustrated in FIG. 18, a large number of objects that correspond to "water" are present on the lower side of the live preview image 130 (on the lower side in FIG. 18), and a large number of objects that correspond to "tree" are present on the upper side thereof (on the upper side in FIG. 18). As described in the above-described embodiments, an image in which trails of "water" are recorded tends to be preferred by users, and an image in which trails of "tree" are not recorded tends to be preferred by users. Accordingly, the CPU 74 of this embodiment uses the boundary between the "water" objects and the "tree" objects as a boundary line 140 to divide the live preview image 130 into a division region 142 and a division region 144.

In the next step S104A, the CPU 74 determines the exposure time for each of the division region 142 and the division region 144. The method for determining the exposure time for each of the division region 142 and the division region 144 is not specifically limited. In this embodiment, for example, the CPU 74 first obtains information 250 indicating correspondences between types of objects and exposure times, an example of which is illustrated in FIG. 19. The information 250 indicating the correspondences may be stored in advance in the secondary storage unit 78C or may be stored in the memory card 66. A form may be employed in which the information 250 indicating the correspondences is downloaded from an external apparatus.

The CPU 74 refers to the information 250 indicating the correspondences and determines an exposure time corresponding to the type of object that represents the division region 142 and an exposure time corresponding to the type of object that represents the division region 144 as the exposure time for the division region 142 and that for the division region 144. Specifically, the type of object that represents the division region 142 is "water", and therefore, the CPU 74 refers to the information 250 indicating the correspondences and determines an exposure time corresponding to "water" to be the exposure time for the division region 142. Further, the type of object that represents the division region 144 is "tree", and therefore, the CPU 74 refers to the information 250 indicating the correspondences and determines an exposure time corresponding to "tree" to be the exposure time for the division region 144. For example, the exposure time corresponding to "water", which is the type of object representing the division region 142, is longer than the exposure time corresponding to "tree", which is the type of object representing the division region 144.

As described above, in the image capturing apparatus 10C of this embodiment, the CPU 74 identifies the types of objects included in the live preview image 130 by performing an image recognition process and divides the live preview image 130 into the division region 142 and the division region 144 on the basis of the result of identification. Then, the CPU 74 refers to the information 250 indicating the correspondences and determines the exposure time for each of the division region 142 and the division region 144 on the basis of the type of object that represents the division region 142 and the type of object that represents the division region 144.

Accordingly, with the image capturing apparatus 10C of this embodiment, even in a case where the user is not familiar with operations of the image capturing apparatus 10C, the live preview image 130 can be appropriately divided into division regions, and an appropriate exposure time can be determined.

Fifth Embodiment

A fifth embodiment will be described in detail below. In this embodiment, components the same as those described in the first embodiment described above are assigned the same reference numerals, and descriptions thereof will be omitted.

For example, as illustrated in FIG. 1 to FIG. 3, an image capturing apparatus 10D of this embodiment is different from the image capturing apparatus 10 of the first embodiment described above in that the image capturing apparatus 10D has an image capturing apparatus main body 12D instead of the image capturing apparatus main body 12.

For example, as illustrated in FIG. 3, the image capturing apparatus main body 12D is different from the image capturing apparatus main body 12 in that the image capturing apparatus main body 12D has a control unit 46D instead of the control unit 46. The control unit 46D is different from the control unit 46 in that the control unit 46D has a secondary storage unit 78D instead of the secondary storage unit 78.

For example, as illustrated in FIG. 3, the secondary storage unit 78D is different from the secondary storage unit 78 in that the secondary storage unit 78D stores an amount-of-exposure control process program 79D instead of the amount-of-exposure control process program 79. The CPU 74 reads from the secondary storage unit 78D and loads to the primary storage unit 76 the amount-of-exposure control process program 79D, and performs an amount-of-exposure control process illustrated in FIG. 20 in accordance with the loaded amount-of-exposure control process program 79D. The CPU 74 executes the amount-of-exposure control process program 79D to thereby operate as an example of the first control unit and the second control unit of the present disclosure.

Now, as the operations of the image capturing apparatus 10D of this embodiment, the amount-of-exposure control process illustrated in FIG. 20 will be described. For an operation the same as that in the first embodiment described above, a description thereof will be omitted.

Figure 20:
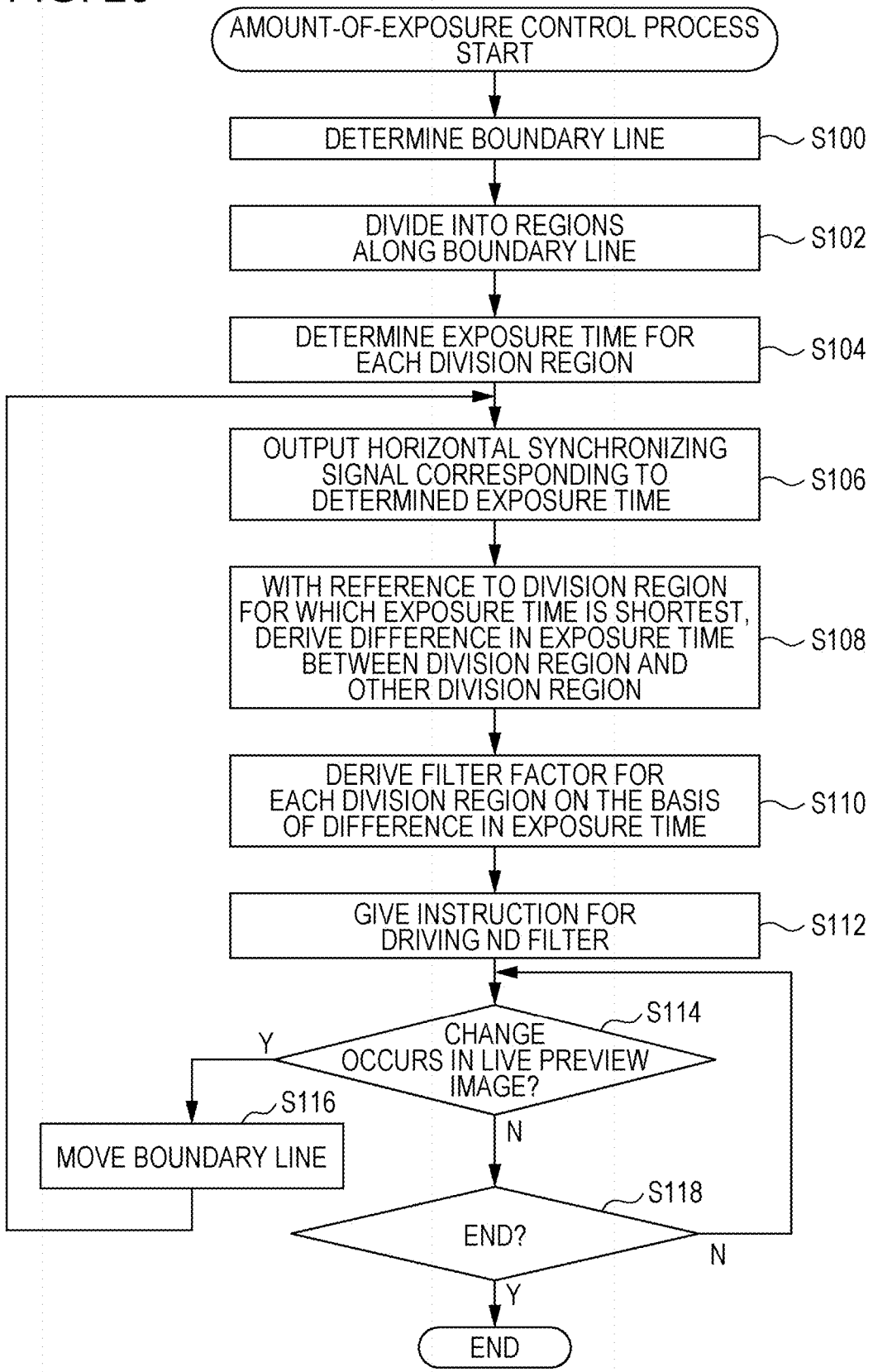
FIG. 20 is a flowchart illustrating an example flow of an amount-of-exposure control process according to the fifth embodiment.

As illustrated in FIG. 20, the amount-of-exposure control process of this embodiment is different from the amount-of-exposure control process (see FIG. 6) of the first embodiment described above in that the process from step S114 to step S118 is performed after step S112.

As described above, in a case where the process up to step S112 in the amount-of-exposure control process is performed, the image displayed on the touch panel display 29 becomes an image for which the amount of exposure is controlled by the CPU 74. For convenience of description, it is assumed below that the live preview image 100 is displayed on the touch panel display 29.

Thereafter, a change may occur in the live preview image 100 displayed on the touch panel display 29. A change in the live preview image 100 includes a change in the image capture scene, a change in an image of a photographic subject (image capture target) included in the captured image, a change in framing (angle of view), a change caused by enlargement, reduction, and so on, and a change in the image capture area. A change in a photographic subject includes a change in a natural phenomenon that is a photographic subject, such as sunrise or sunset and how light is reflected. Accordingly, a change in a captured image may occur not only in a case where the image capturing apparatus 10D moves but also in a case where the image capturing apparatus 10D does not move.

In step S114, the CPU 74 determines whether a change occurs in the live preview image 100. The method for the CPU 74 to determine whether a change occurs in the live preview image 100 is not specifically limited. For example, in a case where the image capturing apparatus 10D includes a gyro sensor for detecting information about the angular velocity in each of the yaw direction, the roll direction, and the pitch direction, the CPU 74 may determine that a change occurs in the live preview image 100 in a case where an angular velocity corresponding to the angular velocity information detected by the gyro sensor exceeds a predetermined threshold value.

In a case where a change occurs in the live preview image 100, the result of determination in step S114 is positive, and the flow proceeds to step S116. In step S116, the CPU 74 moves the position of the boundary line 120 in accordance with the change in the live preview image, and thereafter, the flow returns to step S106.

The method for moving the boundary line 120 in accordance with a change in the live preview image 100 is not specifically limited. In a case where the angular velocity information is detected by the gyro sensor as in the example described above, the CPU 74 moves the boundary line at a rate corresponding to the rate or acceleration of the change in the live preview image 100. As such a method, for example, the CPU 74 may use an image of a region that includes a portion of the boundary line 120 in the live preview image 100 before movement as a template image to perform template matching with the live preview image 100 after movement, thereby determining the position of the boundary line 120 and displaying the boundary line 120 in the determined position to move the boundary line 120. Alternatively, for example, the CPU 74 may derive optical flows of the boundary line 120 in the live preview image 100 before and after movement, thereby determining the position of the boundary line 120 and displaying the boundary line 120 in the determined position to move the boundary line 120. Further, for example, the CPU 74 may determine the position of the boundary line 120 in accordance with movement of the image capturing apparatus 10D sensed on the basis of the angular velocities in the respective directions sensed by the gyro sensor (angular velocity information input from a sensor I/F) and display the boundary line 120 in the determined position to move the boundary line 120. Alternatively, the CPU 74 may use an image analysis algorithm, such as KLT (Kanade-Lucas-Tomasi Feature Tracker), to move the boundary line 120.

On the other hand, in a case where a change does not occur in the live preview image 100, the result of determination in step S114 is negative, and the flow proceeds to step S118.

In step S118, the CPU 74 determines whether to end the amount-of-exposure control process. In a case of not ending the amount-of-exposure control process, the result of determination in step S118 is negative, and the flow returns to step S114. On the other hand, in a case of ending the amount-of-exposure control process, the result of determination in step S118 is positive, and the amount-of-exposure control process ends.

As described above, in the image capturing apparatus 10D of this embodiment, the CPU 74 automatically moves the boundary line 120 in accordance with a change in the live preview image 100, and performs control of the amount of exposure based on the exposure time in combination with control of the amount of exposure by the ND filter 80 for each of the division region 122 and the division region 124 obtained by division along the boundary line 120 after movement.

Therefore, even in a case where a change occurs in the live preview image 100, the user need not re-specify the boundary line 120, which can increase user convenience without compromising the image quality of the captured image.

As described above, the image capturing apparatuses 10 (10A, 10B, 10C, and 10D) of the above-described embodiments include: the image capturing unit that includes the imaging device 22 in which the plurality of pixels 90 are arranged in a two-dimensional array and that outputs an image signal obtained by image capturing of a photographic subject by the imaging device 22 through the image capturing optical system; the image processing unit 56 that generates a captured image based on the image signal; and the ND filter 80 that controls the amount of light incident on the imaging device 22 per unit time.

The CPU 74 performs the amount-of-exposure control process to thereby function as the first control unit that controls the exposure time of the pixels 90 to control the amount of exposure of the pixels 90 for each of the plurality of division regions obtained by dividing a captured image and as the second control unit that controls the light transmittance of the ND filter 80 to adjust the difference in amount of exposure between the plurality of division regions for each of which the amount of exposure is controlled by controlling the exposure time. On the touch panel display 29, the captured image obtained with the amount of exposure controlled by the CPU 74 in accordance with a combination of the exposure time and the light transmittance of the ND filter 80 is displayed.

Accordingly, the CPU 74 of the embodiments controls the exposure time for each of the division regions (the division regions 122 and 124 or the division regions 142 and 144) and controls the light transmittance for a division region (the division region 122 or the division region 142), for which the exposure time is long, with the ND filter 80 to thereby adjust the difference in amount of exposure caused as a result of controlling the exposure time. Therefore, with the image capturing apparatuses 10 (10A, 10B, 10C, and 10D) of the above-described embodiments, a captured image in which both the effect of long exposure and the effect of short exposure coexist can be obtained.

Accordingly, with the image capturing apparatuses 10 (10A, 10B, 10C, and 10D) of the above-described embodiments, an expression desired by the user can be achieved.

For convenience of description, the image capturing apparatuses 10, 10A, 10B, 10C, and 10D are hereinafter referred to as "image capturing apparatus" without the reference numerals in a case where the image capturing apparatuses need not be distinguished from each other. For convenience of description, the image capturing apparatus main bodies 12, 12A, 12B, 12C, and 12D are hereinafter referred to as "image capturing apparatus main body" without the reference numerals in a case where the image capturing apparatus main bodies need not be distinguished from each other. For convenience of description, the secondary storage units 78, 78A, 78B, 78C, and 78D are hereinafter referred to as "secondary storage unit" without the reference numerals in a case where the secondary storage units need not be distinguished from each other. Further, for convenience of description, in a case where the amount-of-exposure control process programs 79, 79A, 79B, 79C, and 79D are collectively referred to, the amount-of-exposure control process programs are referred to as "amount-of-exposure control process program" without the reference numerals.

Figure 21:
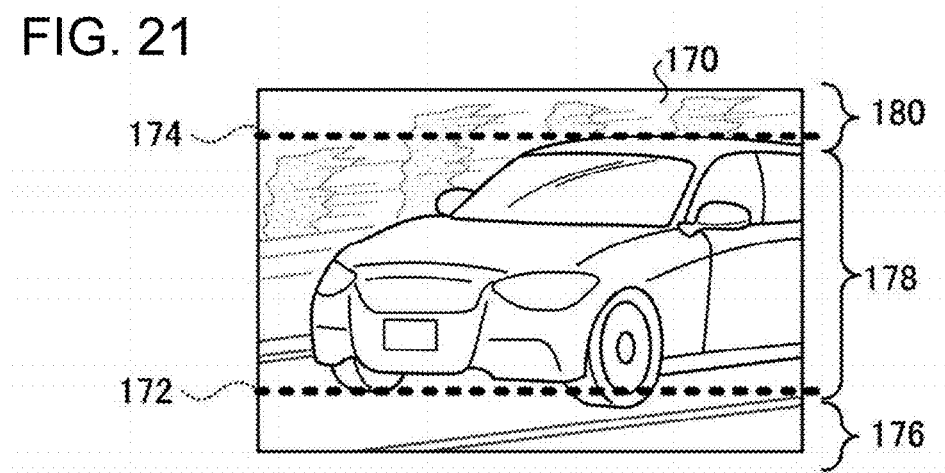
FIG. 21 is a diagram illustrating an example live preview image.
Figure 22:
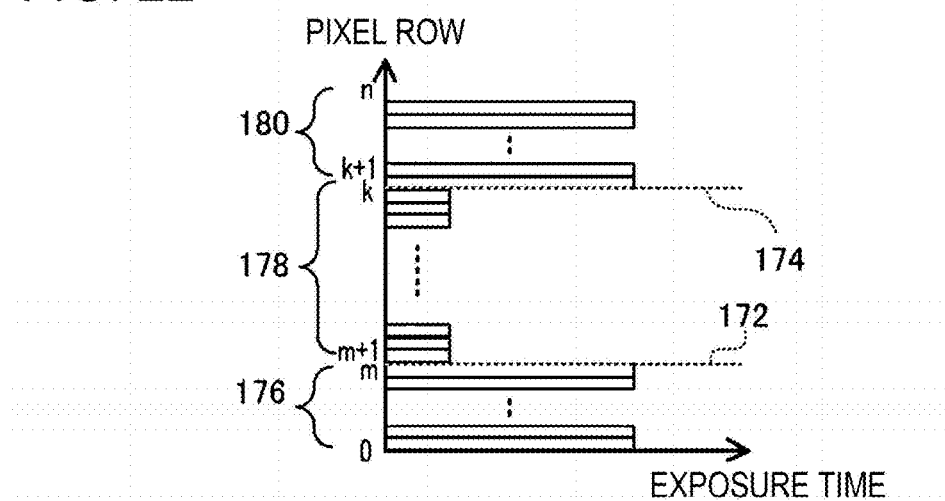
FIG. 22 is a diagram for explaining the exposure time for the live preview image illustrated in FIG. 21.

In the above-described embodiments, the form in which the live preview image is divided into two division regions has been described; however, the live preview image may be divided into three or more division regions. For example, for an example live preview image 170 illustrated in FIG. 21, in a case where the user wants to capture an image of a vehicle present on pixel rows in the center portion of the live preview image 170 with panning, the CPU 74 divides the live preview image 170 into a division region 176, a division region 178, and a division region 180 along a boundary line 172 and a boundary line 174 as in the example illustrated in FIG. 22. The exposure time corresponding to the shutter speed in this case is shortest for the division region 178 in which the image of the vehicle is included. In this case, the CPU 74 controls the light transmittance of the ND filter 80 to thereby perform control for making each of the difference in amount of exposure between the division region 178 and the division region 180 and the difference in amount of exposure between the division region 178 and the division region 176 homogeneous with reference to the amount of exposure based on the exposure time for the division region 178.

Figure 23:
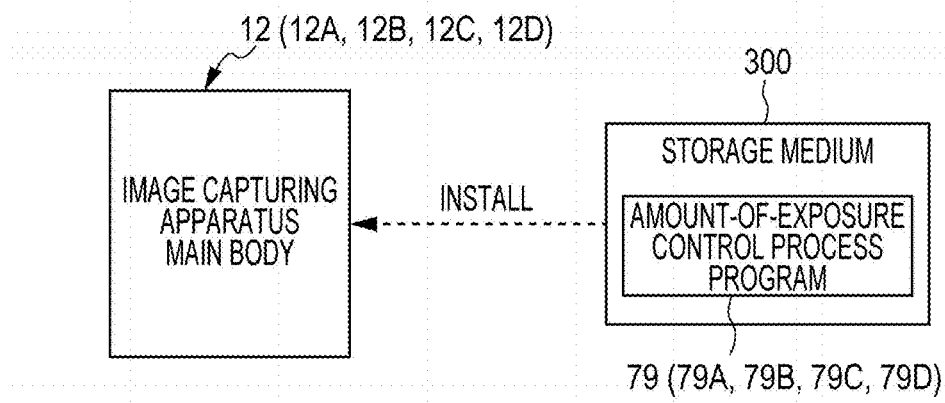
FIG. 23 is a schematic diagram illustrating an example form in which an amount-of-exposure control process program according to the embodiments is installed on an image capturing apparatus main body from a storage medium in which the amount-of-exposure control process program is stored.

In the above-described embodiments, the example case where the amount-of-exposure control process program is read from the secondary storage unit 78 has been described; however, the amount-of-exposure control process program need not be stored in the secondary storage unit at the beginning. For example, as illustrated in FIG. 23, the amount-of-exposure control process program may be first stored in advance in any portable storage medium 300, such as an SSD (solid state drive), a USB (universal serial bus) memory, or a CD-ROM (compact disc read-only memory). In this case, the amount-of-exposure control process program stored in the storage medium 300 is installed on the image capturing apparatus main body, and the installed amount-of-exposure control process program is executed by the CPU 74.

Alternatively, the amount-of-exposure control process program may be stored in advance in a storage unit of another computer, server apparatus, or the like connected to the image capturing apparatus main body via a communication network (not illustrated), and the amount-of-exposure control process program may be downloaded in response to a request from the image capturing apparatus main body. In this case, the downloaded amount-of-exposure control process program is executed by the CPU 74.

The amount-of-exposure control process described in the above-described embodiments is only an example. Therefore, an unnecessary step may be deleted, a new step may be added, or the order of processes may be changed without departing from the spirit, as a matter of course.

In the above-described embodiments, the example case where the amount-of-exposure control process is implemented by using a software configuration using a computer has been described; however, the technique of the present disclosure is not limited to this. For example, instead of the software configuration using a computer, the amount-of-exposure control process may be performed by using only a hardware configuration, such as an FPGA (field-programmable gate array) or an ASIC (application specific integrated circuit). Alternatively, the amount-of-exposure control process may be performed by using a configuration obtained by combining the software configuration and the hardware configuration.

All documents, patent applications, and technical standards described in this specification are incorporated herein by reference to the same extent as in a case where the documents, patent applications, and technical standards are specifically and individually described as being incorporated herein by reference.

REFERENCE SIGNS LIST

10, 10A, 10B, 10C, 10D image capturing apparatus
12, 12A, 12B, 12C, 12D image capturing apparatus main body
13, 15 mount
14 image capturing lens
16 focus ring
18 lens unit
19 aperture diaphragm
20 focus lens
22 imaging device
22A photosensitive surface
24 dial
26 release button
28 display
29 touch panel display
30 cross key
32 MENU/OK key
34 BACK/DISP button
36 viewfinder
38 touch panel
40 control device
42 first mirror
44 second mirror
46, 46A, 46B, 46C, 46D control unit
48 mirror driving unit
50 imaging device driver
52 image signal processing circuit
54 image memory
56 image processing unit
58 display control unit
60 accepting I/F
62 accepting device
64 medium I/F
66 memory card
72 external I/F
74 CPU
76 primary storage unit
78, 78A, 78B, 78C, 78D secondary storage unit
79, 79A, 79B, 79C, 79D amount-of-exposure control process program
80 ND filter
81 bus line
82 ND filter driving unit
90 pixel
100, 130, 150, 170, 500, 600 live preview image
120, 140, 172, 174 boundary line
122, 124, 142, 144, 176, 178, 180 division region
152, 154, 502, 504, 602, 604 partial image
200 histogram
202, 204 peak
206 range
208 brightness value
250 information
300 storage medium α photosensitive surface cover position
β photosensitive surface open position
L1 optical axis

What is claimed is:

1. An image capturing apparatus comprising:
an image sensor, in which a plurality of pixels are arranged in a two-dimensional array, that outputs an image signal obtained by image capturing of a photographic subject through an image capturing optical system;
a processor configured to generate a captured image based on the image signal; and
a ND filter that controls an amount of light incident on the image sensor per unit time,
wherein the processor further configured to
control an exposure time of the pixels to control an amount of exposure of the pixels for each of a plurality of division regions obtained by dividing the captured image,
obtain difference between amount of exposure of the plurality of division regions and reference amount of exposure, in a case where amount of exposure of a divided region having the shortest exposure time among the plurality of division regions is the reference amount of exposure, and
perform control to reduce the amount of exposure of the plurality of division regions for each division regions according to the difference in amount of exposure.

2. The image capturing apparatus according to claim 1, wherein
the processor further configured to perform control to make the difference in amount of exposure between the plurality of division regions be within a predetermined range.

3. The image capturing apparatus according to claim 2, wherein
the processor further configured to
determine an amount of exposure of the entire image sensor, and
perform control for adjusting the amount of exposure of the plurality of division regions for which the amount of exposure is controlled, to the determined amount of exposure.

4. The image capturing apparatus according to claim 1, wherein
the processor further configured to
determine an amount of exposure of the entire image sensor, and
set the amount of exposure of each of the plurality of division regions to the determined amount of exposure, to adjust the difference in amount of exposure between the plurality of division regions.

5. The image capturing apparatus according to claim 1, wherein
the processor further configured to perform control for adjusting the difference in amount of exposure between the plurality of division regions with reference to the amount of exposure for a division region that satisfies a predetermined condition among the plurality of division regions.

6. The image capturing apparatus according to claim 2, wherein
the processor further configured to perform control for adjusting the difference in amount of exposure between the plurality of division regions with reference to the amount of exposure for a division region that satisfies a predetermined condition among the plurality of division regions.

7. The image capturing apparatus according to claim 3, wherein
the processor further configured to perform control for adjusting the difference in amount of exposure between the plurality of division regions with reference to the amount of exposure for a division region that satisfies a predetermined condition among the plurality of division regions.

8. The image capturing apparatus according to claim 4, wherein
the processor further configured to perform control for adjusting the difference in amount of exposure between the plurality of division regions with reference to the amount of exposure for a division region that satisfies a predetermined condition among the plurality of division regions.

9. The image capturing apparatus according to claim 5, wherein
the processor further configured to use, as the predetermined condition, a condition that the exposure time is shortest.

10. The image capturing apparatus according to claim 6, wherein
the processor further configured to use, as the predetermined condition, a condition that the exposure time is shortest.

11. The image capturing apparatus according to claim 1, wherein
the processor further configured to divide the captured image into the plurality of division regions along a boundary derived from a result of analysis of the captured image.

12. The image capturing apparatus according to claim 11, wherein
in a case where a change occurs in the captured image, the processor further configured to adjust a position of the boundary on the basis of the change in the captured image.

13. The image capturing apparatus according to claim 1, further comprising
an interface that accepts an exposure time for each of the plurality of division regions, wherein
the processor further configured to perform control in accordance with the exposure time accepted by the interface.

14. The image capturing apparatus according to claim 1, wherein
the processor further configured to
identify, for each region of the captured image, for each photographic subject included in the captured image, or for each pixel corresponding to the captured image, a corresponding type of object on the basis of a recognition result of recognizing the captured image, and divide the captured image into the plurality of division regions on the basis of a result of identification,
determine an exposure time for each of the plurality of division regions on the basis of predetermined correspondences between types of objects and exposure times, and
perform control in accordance with the determined exposure time.

15. The image capturing apparatus according to claim 1, wherein
the processor further configured to control the exposure time of the pixels for each row of the array of the plurality of pixels.

16. The image capturing apparatus according to claim 1, wherein
the ND filter includes an electrochromic element or a liquid crystal element.

17. The image capturing apparatus according to claim 1, wherein
the plurality of division regions includes a first division region and a second division region, and
the processor further configured to
set an exposure time of a pixel corresponding to the first division region to be longer than an exposure time of a pixel corresponding to the second division region, to make amount of exposure of the pixel corresponding to the first division region smaller than amount of exposure of the pixel corresponding to the second division region.

18. The image capturing apparatus according to claim 1, further comprising:
a display that displays the captured image; and
a touch panel that constitutes a touch panel display together with the display.

19. A control method for an image capturing apparatus, the control method including a process comprising:
generating a captured image based on an image signal obtained by image capturing of a photographic subject by an image sensor, in which a plurality of pixels are arranged in the two-dimensional array, through an image capturing optical system;
controlling an exposure time of the pixels to control an amount of exposure of the pixels for each of a plurality of division regions obtained by dividing the captured image;
controlling a ND filter that controls an amount of light incident on the image sensor per unit time;
obtaining the difference between the amount of exposure of the plurality of division regions and a reference amount of exposure, in the case where the amount of exposure of a divided region having the shortest exposure time among the plurality of division regions is the reference amount of exposure; and
performing control to reduce the amount of exposure of the plurality of division regions for each division regions according to the difference in amount of exposure.

20. A non-transitory computer readable recording medium storing a control program for an image capturing apparatus for causing a computer to perform a process comprising:
generating a captured image based on an image signal obtained by image capturing of a photographic subject by an image sensor, in which a plurality of pixels are arranged in the two-dimensional array, through an image capturing optical system;
controlling an exposure time of the pixels to control an amount of exposure of the pixels for each of a plurality of division regions obtained by dividing the captured image;
controlling a ND filter that controls an amount of light incident on the image sensor per unit time;
obtaining the difference between the amount of exposure of the plurality of division regions and a reference amount of exposure, in the case where the amount of exposure of a divided region having the shortest exposure time among the plurality of division regions is the reference amount of exposure; and
performing control to reduce the amount of exposure of the plurality of division regions for each division regions according to the difference in amount of exposure.

* * * * *